United States Patent
Choi et al.

(10) Patent No.: US 11,031,572 B2
(45) Date of Patent: Jun. 8, 2021

(54) DISPLAY DEVICE

(71) Applicant: LG Display Co., Ltd., Seoul (KR)

(72) Inventors: Dong-Il Choi, Seoul (KR); Kwan-Soo Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/441,760

(22) Filed: Jun. 14, 2019

(65) Prior Publication Data

US 2019/0386242 A1   Dec. 19, 2019

(30) Foreign Application Priority Data

Jun. 14, 2018 (KR) .................. 10-2018-0068116

(51) Int. Cl.
*H01L 29/08* (2006.01)
*H01L 51/52* (2006.01)
*H01L 27/32* (2006.01)

(52) U.S. Cl.
CPC ...... *H01L 51/5234* (2013.01); *H01L 27/3218* (2013.01); *H01L 27/3246* (2013.01); *H01L 51/5218* (2013.01)

(58) Field of Classification Search
CPC ............ H01L 51/5218; H01L 51/5234; H01L 27/3218; H01L 27/3246
See application file for complete search history.

(56) References Cited

U.S. PATENT DOCUMENTS

| | | | |
|---|---|---|---|
| 2015/0014658 A1* | 1/2015 | Choung | H01L 51/5228 257/40 |
| 2018/0005574 A1* | 1/2018 | Kim | H01L 51/5296 |
| 2018/0194634 A1* | 7/2018 | Kang | C01F 5/02 |
| 2019/0139489 A1* | 5/2019 | Tsujikawa | H05B 33/02 |

* cited by examiner

*Primary Examiner* — Phuc T Dang
(74) *Attorney, Agent, or Firm* — Seed IP Law Group LLP

(57) ABSTRACT

Disclosed is a display device. In the disclosed display device, an emission-side electrode is constituted by a transmissive electrode structure having different configurations for an emission part and a transmission part such that a uniform potential is maintained at the entirety of the transmissive electrode structure, and the transmissive electrode structure enables the emission part to emit light at high brightness while enabling the transmission part to perform transparent display at high transmissivity.

23 Claims, 13 Drawing Sheets

DISPLAY DEVICE

CROSS-REFERENCE TO RELATED APPLICATION(S)

This application claims the benefit of Korean Patent Application No. 10-2018-0068116, filed on Jun. 14, 2018, which is hereby incorporated by reference as if fully set forth herein.

BACKGROUND

Technical Field

The present disclosure relates to a display device, and more particularly to a display device simultaneously enabling transparent display and top emission display while achieving high-brightness emission and low-power driving in each display, and a method for manufacturing the same.

Description of the Related Art

In recent years, with the advent of the information age, the field of displays to visually express electrical information signals has rapidly developed. As such, a variety of flat display devices having superior performance such as slimness, lightness and low power consumption have rapidly been developed as replacements for existing cathode ray tubes (CRTs).

Representative examples of such flat display devices may include liquid crystal display (LCD) devices, plasma display panel (PDP) devices, field emission display (FED) devices, organic light emitting display (OLED) devices, quantum dot display devices, and the like.

Among these displays, self-luminous display devices such as OLED devices or quantum dot display devices are considered as having competitiveness in that they do not require a separate light source while achieving compactness and distinct color display.

Recently, there has been increased demand for a transparent display device capable of achieving transmission of light at both the front and rear sides thereof and displaying an image without obscuring the user's view.

In addition, research is being conducted to simultaneously achieve the above-mentioned self-luminous display and transparent display through modification of arrangement of light emitting diodes.

However, the area for self-luminous display, namely, a self-luminous area, and the area for transparent display, namely, a transparent area, preferentially take into consideration an enhancement in light emission efficiency and an enhancement in transmissivity, respectively, and, as such, have different purposes. For this reason, structures respectively required for the self-luminous area and the transparent area differ from each other and, as such, it may be difficult to embody those structures through a common formation method.

BRIEF SUMMARY

Accordingly, the present disclosure is directed to a display device and a method for manufacturing the same that substantially obviate one or more problems due to limitations and disadvantages of the related art, and more particularly to a display device simultaneously enabling transparent display and top emission display while achieving high-brightness emission and low-power driving in each display and a method for manufacturing the same.

An embodiment of the present disclosure provides a display device wherein an emission-side electrode is constituted by a transmissive electrode structure having different configurations for an emission part and a transmission part such that a uniform potential is maintained at the entirety of the transmissive electrode structure, and the transmissive electrode structure enables the emission part to emit light at high brightness while enabling the transmission part to perform transparent display at high transmissivity.

Additional advantages and features of the disclosure will be set forth in part in the description which follows and in part will become apparent to those having ordinary skill in the art upon examination of the following or may be learned from practice of the disclosure. The embodiments and other advantages of the disclosure may be realized and attained by the structure particularly pointed out in the written description and claims hereof as well as the appended drawings.

To achieve these embodiments and other advantages and in accordance with the purpose of the disclosure, as embodied and broadly described herein, a display device includes a substrate having a plurality of emission parts and a plurality of transmission parts, an organic light emitting layer at each of the plurality of emission parts, a reflective electrode structure at each of the plurality of emission parts between the organic light emitting layer and the substrate, and a transmissive electrode structure having a first layer disposed over the organic light emitting layer to cover the plurality of emission parts and the plurality of transmission parts, and a second layer in an area except for the plurality of transmission parts and contacting the first layer The second layer may be disposed at each of the emission parts. Alternatively, the second layer may include core portions corresponding to respective emission parts, and connecting portions for connecting adjacent ones of the emission parts.

The second layer may include a metal having translucency. The first layer may include a metal having transparency or translucency.

The first layer and the second layer may include Ag in common. Each of the first and second layers may further include at least one of Mg and Yb. The second layer may have a thickness of 6 to 15 nm, and the first layer may have a thickness of 4 to 12 nm.

Alternatively, the first layer may include a transparent oxide having at least one metal selected from indium, titanium, zinc and tin. The second layer may include two or more metals, at least one of the two or more metals may be Ag, and the remaining metal(s) of the two or more metals may be metal(s) functioning to prevent aggregation of Ag while having a work function equal to or lower than a work function of Ag. In this case, the second layer may be disposed nearer to the organic light emitting layer than the first layer.

The first layer may have a thickness of 30 to 120 nm, and the second layer may have a thickness of 10 to 27 nm.

Each of the emission parts may include first to third emission pixels for emitting different colors. Each of the first to third emission pixels of the respective emission part may be provided with banks respectively disposed at a corresponding one of boundaries between adjacent ones of the first to third emission pixels and a corresponding one of boundaries between the emission part and the transmission part.

At least one of a first organic common layer may be further included in the display device between organic light emitting layer and the reflective electrode structure and between the organic light emitting layer and the transmissive electrode structure. The at least one of the first organic common layer may extend up to the transmission parts.

The second layer of the transmissive electrode structure may be disposed at the emission part, and the first layer of the transmissive electrode structure may be disposed at the transmission part.

In another embodiment of the present disclosure, a method for manufacturing a display device, includes preparing a substrate having a plurality of pixels and emission and transmission parts provided at each of the pixels, providing a reflective electrode structure at each of the emission parts, forming an organic light emitting layer on the reflective electrode structure, and laminating a first layer having a translucent metal or a transparent electrode material to extend over the plurality of pixels each having the emission and transmission parts and a second layer having a translucent metal to extend over an area except for the transmission part in each of the pixels such that the second layer contacts the first layer, thereby forming a transmissive electrode structure.

It is to be understood that both the foregoing general description and the following detailed description of embodiments of the present disclosure are exemplary and explanatory and are intended to provide further explanation of the disclosure.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiment(s) of the disclosure and along with the description serve to explain the principles of the disclosure. In the drawings.

DETAILED DESCRIPTION

Figure 1:
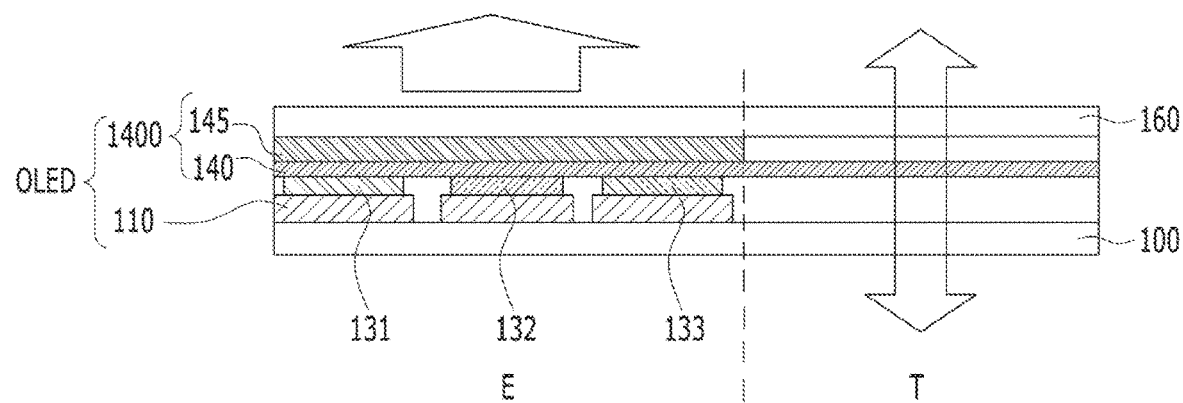
FIG. 1 is a cross-sectional view schematically illustrating a principle of a display device according to a first embodiment of the present disclosure.

Hereinafter, preferred embodiments of the present disclosure will be described in detail with reference to the accompanying drawings. Throughout the disclosure, the same reference numerals designate substantially the same constituent elements. In describing the present disclosure, moreover, a detailed description will be omitted when a specific description of publicly known technologies to which the disclosure pertains is judged to obscure the gist of the present disclosure. In addition, names of constituent elements used in the following description are selected for easy understanding of the present disclosure, and may differ from names of practical products.

The shape, size, ratio, angle, number and the like shown in the drawings to illustrate the embodiments of the present disclosure are only for illustration and are not limited to the contents shown in the drawings. Wherever possible, the same reference numbers will be used throughout the drawings to refer to the same or like parts. In the following description, detailed descriptions of technologies or configurations related to the present disclosure may be omitted so as not to unnecessarily obscure the subject matter of the present disclosure. When terms such as "including," "having" and "comprising" are used throughout the specification, an additional component may be present, unless "only" is used. A component described in a singular form encompasses components in a plural form unless particularly stated otherwise.

It should be interpreted that the components included in the embodiment of the present disclosure include an error range, although there is no additional particular description thereof.

In describing a variety of embodiments of the present disclosure, when terms for location relation such as "on," "above," "under" and "next to" are used, at least one intervening element may be present between two elements unless "right" or "direct" is used.

In describing a variety of embodiments of the present disclosure, when terms for temporal relation, such as "after," "subsequently," "next" and "before," are used, a non-continuous case may be present, unless "right" or "direct" is used.

In describing a variety of embodiments of the present disclosure, terms such as "first" and "second" may be used to describe a variety of components, but these terms only aim to distinguish the same or similar components from one another. Accordingly, throughout the specification, a "first" component may be the same as a "second" component within the technical concept of the present disclosure, unless specifically mentioned otherwise.

The respective features of various embodiments according to the present disclosure can be partially or entirely joined or combined and technically variably related or operated, and the embodiments can be implemented independently or in combination.

Figure 2:
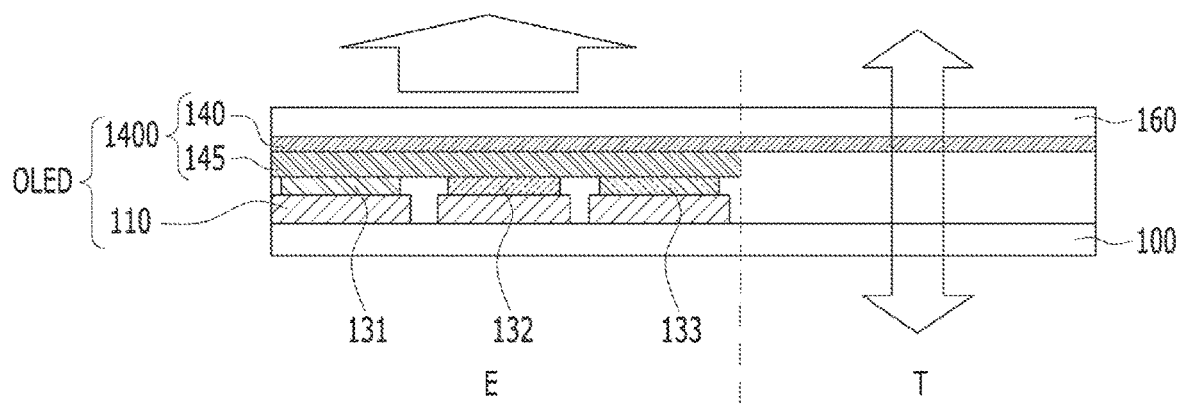
FIG. 2 is a cross-sectional view schematically illustrating a principle of a display device according to a second embodiment of the present disclosure.

FIGS. 1 and 2 are cross-sectional views schematically illustrating principles of display devices according to first and second embodiments of the present disclosure, respectively.

As illustrated in FIGS. 1 and 2, each display device according to the present disclosure includes a substrate 100 having a plurality of pixels, an emission part E and a transmission part T, which are provided at each of the pixels, organic light emitting layers 131, 132 and 133 may be provided at the emission part E, a reflective electrode structure 110 provided between each of the organic light emitting layers 131, 132 and 133 and the substrate 100, and a transmissive electrode structure 1400 having a first layer 140 disposed over the organic light emitting layers 131, 132 and 133 to cover the plurality of pixels on the substrate 100, and a second layer 145 provided in an area except for the transmission part T and contacting the first layer 140. To high transparency, as shown in FIGS. 1 and 2, the organic light emitting layers 131, 132 and 133 may be provided only at the emission part E.

The difference between the first and second embodiments of the present disclosure is which layer of the first layer 140 and the second layer 145 is disposed at an upper side. In the first embodiment of the present disclosure, as illustrated in FIG. 1, the first layer 140 is disposed at a lower side near the organic light emitting layers 131, 132 and 133, and the second layer 145 is disposed at an upper side. On the other hand, in the second embodiment of the present disclosure, as illustrated in FIG. 2, the second layer 145 is disposed at a lower side near the organic light emitting layers 131, 132 and 133, and the first layer 140 is disposed at an upper side. In common in the first and second embodiments, the first layer 140 is formed to have an integrated structure without being patterned in an active area AA, in which the emission part E and transmission part T of the substrate 100 are defined, and the second layer 145 is disposed to correspond to at least the emission part E through patterning.

For reference, in the display device, the active area AA is an area which is provided with a plurality of pixels within the substrate 100, to achieve display. At the outside of the active area AA, a pad section is disposed on the substrate 100. A plurality of connecting lines, etc., are provided at the pad section. An area of the substrate 100 outside the active area AA may be shielded by a bezel or an enclosure.

In common in the first and second embodiments of the present disclosure, the first layer 140 and the second layer 145 in the transmissive electrode structure 1400 contact each other. As the first layer 140 and the second layer 145 in the transmissive electrode structure 1400 contact each other, the transmissive electrode structure 1400 may be used as a cathode having a uniform potential throughout all pixels of the substrate 100 and, as such, one-side emission electrodes of organic light emitting elements OLED have the same potential.

In the display device of the present disclosure, organic light emitting elements OLED are formed at the emission part E. Each organic light emitting element OLED is formed through lamination of the reflective electrode structure 110, the organic light emitting layer 131, 132 or 133, and the transmissive electrode structure 1400. The reflective electrode structure 110 and the organic light emitting layers 131, 132 and 133 are patterned and, as such, the organic light emitting layers 131, 132 and 133, which emit different colors, respectively, are divided from one another. Accordingly, organic light emitting elements OLED, which vertically emit light of different colors, are formed in regions of the organic light emitting layers 131, 132 and 133, respectively. The organic light emitting elements OLED are connected to different thin film transistors (not shown), to receive different drive currents, and, as such, may operate in an independent manner.

The reflective electrode structure 110 includes at least one layer constituting a reflective electrode. The reflective electrode structure 110 may further include a transparent electrode layer disposed on and under the reflective electrode, or either on or under the reflective electrode. The reflective electrode structure 110 of each organic light emitting element OLED is electrically connected to the thin film transistor (TFT) connected to the organic light emitting element OLED and, as such, receives an electrical signal from the TFT. Thus, operation of the organic light emitting elements OLED in each pixel is controlled. The reflective electrode structure 110 functions as a kind of anode.

Although FIGS. 1 and 2 schematically show that each organic light emitting layer 131, 132 or 133 is disposed, as a single layer, between the reflective electrode structure 110 and the transmissive electrode structure 1400 in each organic light emitting element OLED, the present disclosure is not limited thereto. A transport layer associated with electron transport or a buffer layer may be disposed between each organic light emitting layer 131, 132 or 133 and the reflective electrode structure 110 or between each organic light emitting layer 131, 132 or 133 and the transmissive electrode structure 1400. Examples of the transport layer may include a hole injection layer, a hole transport layer, an electron blocking layer, a hole blocking layer, an electron transport layer, and an electron injection layer. The transport layer or the buffer layer is an organic layer, and may be deposited without using a mask, and, as such, may be formed not only on the emission part E, but also on the transmission part T. The transport layer or the buffer layer is a transparent layer.

Meanwhile, in the display device of the present disclosure, the second layer 145 is made of a metal having translucency. The first layer 140 is made of a metal having transparency or translucency. When the first layer 140 is made of a metal having translucency, the second layer 145 may be formed using the same material as the first layer 140. Of course, the present disclosure is not limited to the above-described condition, and the second layer 145 may be made of a material different from that of the first layer 140 while having translucency. In either case, the second layer 145 disposed at the emission part E should enhance effects of extracting light emitted through the transmissive electrode structure 1400 in accordance with reflective interference occurring between the reflective electrode structure 110 and the transmissive electrode structure 1400 facing each other in the emission part E, and the first layer 140 should have no influence on transmission of light at the transmission part T. To this end, the thicknesses and materials of the first and second layers 140 and 145 are limited.

Meanwhile, the reason why the first and second layers 140 and 145 are collectively referred to as the transmissive electrode structure in the display device of the present disclosure is because the first and second layers 140 and 145 are disposed near the side, through which light is emitted, and substantially emit light emerging from the light emitting layers 131, 132 and 133.

The organic light emitting layers 131, 132 and 133 at the emission part E emit light in both an upward direction and a downward direction. Light directed upwards may be directly emitted through the transmissive electrode structure 1400 constituted by the laminated first and second layers 140 and 145, whereas light directed downwards may be emitted through the transmissive electrode structure 1400 after being reflected by the reflective electrode structure 110.

In this case, when either the first layer 140 or the second layer 145, or at least one of the first and second layers 140 and 145, for example, the second layer 145, has translucency, the transmissive electrode structure 1400 may exhibit an enhanced light extraction efficiency in accordance with selective Fabry-Perot reflective interference occurring between the reflective electrode structure 110 and the transmissive electrode structure 1400 at the emission part E.

Generally, in a transparent display device, an emission-side electrode having a uniform thickness is shared by a plurality of pixels and, as such, is provided even at a transmission part. In this case, if the emission-side electrode is thick, there may be a problem in that the transparency of the transmission part is degraded. When the emission-side electrode has a reduced thickness in order to increase the transparency of the transmission part, there may be a problem in that nonuniformity of brightness occurs due to an increase in resistance of the emission-side electrode. Furthermore, although the transparency of the transmission part may increase, the emission part has a reduced cavity and, as such, the extraction amount of light emitted toward the emission side through the emission part is reduced. As a result, there may be a problem in that the entirety of the display device exhibits a degraded efficiency.

The display device of the present disclosure eliminates the above-described problems. Light emitted from the organic light emitting layers 131, 132 and 133 at the emission part E is subjected to interference between the reflective electrode structure 110 and the transmissive electrode structure 1400 constituted by the laminated first and second layers 140 and 145 and, as such, may be extracted at high efficiency.

In this case, the light extraction efficiency exhibited in accordance with interference and resonance of light between the reflective electrode structure 110 and the transmissive electrode structure 1400 may be varied in accordance with the distance between an actual reflective electrode layer of the reflective electrode structure 110 and a surface contacting the translucent metal of the transmissive electrode structure 1400 and the positions of the organic light emitting layers 131, 132 and 133.

In the display device of the present disclosure, the transmissive electrode structure 1400 has at least a double structure such that the first and second layers 140 and 145 are deposited at the emission part E, to achieve an enhancement in light extraction efficiency, whereas the first layer 140 may be present at the transmission part T while having a small thickness and, as such, there is no light shielded by the first layer 140 of the transmissive electrode structure 1400 at the transmission part T, thereby achieving an enhancement in light transmissivity. In some case, only the first layer 140 may be present at the transmission part T while having a small thickness and, as such, there is no light shielded by the first layer 140 of the transmissive electrode structure 1400 at the transmission part T, thereby achieving an enhancement in light transmissivity. It may also be possible to secure a uniform potential in the transmissive electrode structure 1400 without presence of an opened electrode region in the transmissive electrode structure 1400, thereby avoiding nonuniformity of brightness.

Hereinafter, the case in which the first layer 140 and the second layer 145 are made of the same translucent material and the case that is not the former case will be described.

(1) The Case in which the First Layer 140 and the Second Layer 145 are Made of Translucent Metals:

In accordance with materials of the first and second layers 140 and 145 in the transmissive electrode structure 1440, which is a light extraction side, the resonance distance in each organic light emitting element may be varied. For example, when the first layer 140 and the second layer 145 are made of identical or similar translucent metals, resonance occurs due to interference between the upper surface of the reflective electrode structure 110 and the lowest surface of the transmissive electrode structure 1400 (the lower surface of the first layer 140 in FIG. 1 or the lower surface of the second layer 145 in FIG. 2) in either the case of FIG. 1 or the case of FIG. 2. In this case, the translucent metal forming each of the first and second layers 140 and 145 may include an alloy of a first metal having high conductivity and a second metal preventing aggregation of the first metal. When the first metal is Ag, the second metal may be Yb or Mg. Although Ag, Yb, and Mg are proposed as examples of the first metal and the second metal, other metals may also be used, so long as these metals do not cause a great electron injection barrier at an interface thereof contacting the organic light emitting layers of the organic light emitting elements or an organic common layer of the organic light emitting elements while maintaining translucency and a uniform potential in the entirety of the transmissive electrode structure 1400. For example, when the first and second layers 140 and 145 are made of AgMg, which is a reflective transparent metal (alloy), taking uniform potential into consideration, each of the first and second layers 140 and 145 may have a thickness reduced to about 5 nm. However, the thicknesses of the first and second layers 140 and 145 should be determined, taking into consideration all of the purity, balance, and efficiency of R, G and B colors.

When the first layer 140 and the second layer 145 are made of, for example, Ag and Mg, Ag and Yb, or alloys of Ag, Mg and Yb, respectively, the overall thickness of the transmissive electrode structure 1400 constituted by lamination of the first and second layers 140 and 145 should be 10 nm or more without exceeding 27 nm in order to maintain translucency (reflective transparency). In this case, it is preferred that the first layer 140 formed in common at the emission part E and the transmission part T have a thickness of 4 to 12 nm, in order to avoid degradation of transparency at the transmission part T. The second layer 145 may be formed at the emission part E have a thickness of 6 to 15 nm in order to obtain a sufficient emission efficiency through an optimal cavity between the reflective electrode structure 110 and the transmissive electrode structure 1400 at the emission part E. It is also preferred that the second layer 145 may be formed only at the emission part E have a thickness of 6 to 15 nm in order to obtain a sufficient emission efficiency through an optimal cavity between the reflective electrode structure 110 and the transmissive electrode structure 1400 at the emission part E. When the first layer 140 has a thickness less than 4 nm, processability may not be secured because the first layer 140 is excessively thin, even though the light transmissivity of the transmission part A is enhanced. As a result, the first layer 140 formed over the entirety of the active area AA may be nonuniform and, as such, a uniform potential may not be maintained at the entirety of the transmissive electrode structure 1400. On the other hand, when the thickness of the first layer 140 made of a translucent metal exceeds 12 nm, the amount of light shielded at the transmission part T is great and, as such, the transparent display device may not secure desired perfect transparency.

Meanwhile, the second layer 145 is laminated at the emission part E, together with the first layer 140, to function as a cathode. Accordingly, when the overall thickness of the transmissive electrode structure 1400, which is a sum of the thicknesses of the first layer 140 and the second layer 145, is 10 to 27 nm, an optimal cavity may be obtained in association with all colors of red, green and blue. For example, when the overall thickness of the transmissive electrode structure 1400 constituted by lamination of the first and second layers 140 and 145 of the reflective transparent electrode is less than 10 nm, the emission efficiency of light emitted upwards may be degraded. In particular, the emission efficiency of long-wavelength light such as red may be degraded, as compared to light of other wavelengths and, as such, color balance may be degraded. In addition, when the overall thickness exceeds 27 nm, the emission efficiency of light emitted upwards may be degraded. In this case, the emission efficiency of short-wavelength light such as blue may be degraded, as compared to light of other wavelengths and, as such, color balance may be degraded. That is, the range of 10 to 27 nm as the overall thickness of the transmissive electrode structure 1400 constituted by lamination of the first and second layers 140 and 145 at the emission part E is determined taking into consideration the white balance of light emitted from the emission part E.

The first layer 140 and the second layer 145 may be made of the same reflective transparent metal or different reflective transparent alloys. For example, when each of the first layer 140 and the second layer 145 is made of an alloy of a first metal and a second metal, the first layer 140 and the second layer 145 may use the same first metal, for example, Ag, while using different second metals, to be constituted by different alloys, respectively. Here, when the first layer 140 and the second layer 145 are made of alloys including Ag in common as the first metals thereof, the second metals have smaller atomic ratios than the first metal. Accordingly, the first and second layers 140 and 145 may secure uniform high conductivity throughout the overall areas thereof and, as such, the transmissive electrode structure 1400 may secure a uniform potential throughout the overall area thereof. In addition, when both the first layer 140 and the second layer 145 are made of translucent alloys, it is preferred that the first layer 140 formed at both the emission part E and the transmission part T have a smaller thickness than the second layer 145. In this case, the transmissive electrode structure 1400 may maintain a uniform potential throughout the entirety thereof, and the transmissivity at the transmission part T may be enhanced.

Hereinafter, the reason why the first and second layers 140 and 145 are laminated at the emission part in the transmissive electrode structure, to increase the thickness of a reflective metal (alloy), will be described with reference to the following Tables 1 and 2.

Experimental examples of Table 1 represent efficiencies and color coordinates in a blue emission zone B_E determined when the transmissive electrode structure 1400 is made of AgMg while having a thickness of 140 Å and under the condition that the thickness of the hole transport layer disposed beneath the light emitting layer is varied. Experimental examples of Table 2 represent efficiencies and color coordinates in a blue emission zone B_E determined when the transmissive electrode structure 1400 is identical to that of Table 1 in that it is made of AgMg, except for a thickness of 70 Å, and under the condition that the thickness of the hole transport layer disposed beneath the light emitting layer is varied.

When experimental examples 4 and 9 representing a CIEy value of 0.072 are compared with each other, taking into consideration the purity of emitted blue light, it may be found that, although the experimental examples 4 and 9 represent the same value of color coordinate CIEy, the experimental example 9, which has a small AgMg thickness, exhibits a reduction in efficiency of 28% or more. That is, the overall thickness of the transmissive electrode structure 1400 made of a reflective transparent metal (alloy) is required to be about 10 nm (100 Å) to 27 nm (270 Å), taking into consideration both the color coordinate value according to color purity and the efficiency at the emission part. In the display device according to each of the first and second embodiments of the present disclosure, accordingly, the total thickness of the first and second layers 140 and 145 is required to be about 10 nm (100 Å) to 27 nm (270 Å) when the first and second layers 140 and 145 are made of identical or similar reflective transparent metals (alloys).

TABLE 1

| | Cathode-AgMg (140 Å) | | | |
|---|---|---|---|---|
| Example | Thickness of Hole Transport Layer (nm) | Efficiency (%) | CIEx | CIEy |
| 1 | 10 | 14.3 | 0.144 | 0.054 |
| 2 | 20 | 33.5 | 0.143 | 0.053 |
| 3 | 30 | 65.2 | 0.139 | 0.057 |
| 4 | 40 | 100.0 | 0.132 | 0.072 |
| 5 | 50 | 119.0 | 0.120 | 0.112 |
| 6 | 60 | 119.4 | 0.105 | 0.191 |

TABLE 2

| | Cathode-AgMg (70 Å) | | | |
|---|---|---|---|---|
| Example | Thickness of Hole Transport Layer (nm) | Efficiency (%) | CIEx | CIEy |
| 7 | 10 | 24.2 | 0.142 | 0.062 |
| 8 | 20 | 50.1 | 0.139 | 0.066 |
| 9 | 27 | 71.9 | 0.136 | 0.072 |
| 10 | 30 | 83.0 | 0.135 | 0.075 |
| 11 | 40 | 112.1 | 0.130 | 0.093 |
| 12 | 50 | 126.9 | 0.124 | 0.125 |

(2) The Case in which the First Layer 140 is Made of a Transparent Electrode Material, and the Second Layer 145 is Made of a Translucent Metal:

When the first layer 140 and the second layer 145 are made of different materials, the first layer 140, which is formed over the entirety of the active area AA, may be formed using a transparent electrode material including a transparent oxide containing at least one metal selected from indium (In), titanium (Ti), zinc (Zn) and tin (Sn). For example, when the first layer 140 is made of a transparent electrode material such as indium tin oxide (ITO) or indium zinc oxide (IZO), the transmission part T exhibits high transmissivity, as compared to the case in which the first layer 140 is made of an Ag alloy having translucency, and as such, it may be possible to increase the thickness of the first layer 140, as compared to the case in which the first layer 140 is made of an Ag alloy. On the other hand, when the first layer 140 is made of a light-transmissive transparent electrode material, it is preferred that the first layer 140 have a thickness of 30 to 120 nm. That is, when the first layer 140, which is disposed in common at the emission part E and the transmission part T, is made of a transparent metal oxide exhibiting low conductivity, as compared to metal, the first layer 140 is formed to have a sufficient thickness of 30 nm or more and, as such, the transmissive electrode structure 1400, which has a large area, may secure a uniform potential without forming a resistance-increased region. In addition, the thickness of the first layer 140 is determined to be 120 nm or less in order to avoid light absorption into the transparent electrode material in embodiments of the disclosure. In this case, a metal having high conductivity may be selected as the first metal of the second layer 145, which has a great atomic ratio, and an alloy of the first and second metals, which contains Mg or Yb capable of preventing aggregation of the first metal, may be selected as the second metal of the second layer 145. In this case, the second metal may include one or more kinds of metals.

Even when the first layer 140 is made of a light-transmissive transparent electrode material, and the second layer 145 is made of a translucent electrode material, as described above, it may be possible to obtain the same effects as those of the above-described case (1) in association with transmissivity of the transmission part T, high efficiency characteristics of the emission part E, and potential uniformity of the transmissive electrode structure 1400, irrespective of whether the first layer 140 is disposed at the upper side or the lower side, so long as the first layer 140 and the second layer 145 are in contact with each other.

Figure 8:
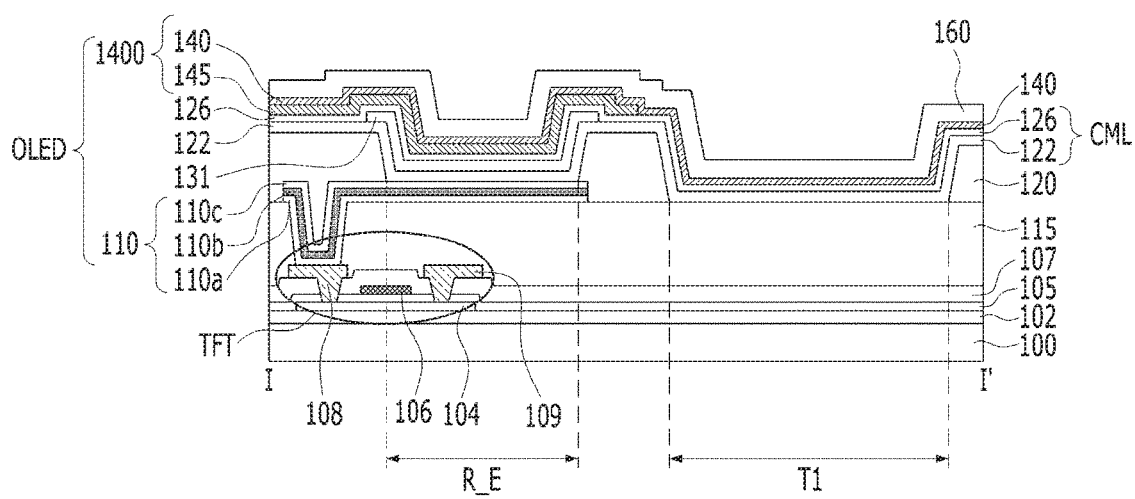
FIG. 8 is a cross-sectional view taken along line I-I' in FIGS. 7A to 7C.

Meanwhile, in this case (the case in which the first layer 140 is made of a light-transmissive transparent electrode material, and the second layer 145 is made of a translucent metal alloy), it is preferred that the second layer 145 having reflective transparency be disposed at a lower side of the first layer 140, in order to allow light emitted from organic light emitting elements OLED to be reflected and resonated between the lower surface of the second layer 145 made of the translucent metal alloy and the upper surface of the reflective electrode structure 110 and finally to be emitted through the transmissive electrode structure 1400 at a high light extraction efficiency. This is because the second layer 145 having translucency generates microresonance, together with the reflective electrode structure 110, at a higher efficiency than that of the first layer 140 being transparent. In this case, the second layer 145 having reflective transparency may contact the organic light emitting layers of organic light emitting elements OLEDs or an organic common layer of the organic light emitting elements OLEDs, and the first layer 140 may contact a capping layer 160 (FIG. 8).

In addition, the second layer 145 selectively formed at the emission part E has direct influence on the amount of light emitted from each organic light emitting element OLED provided at the emission part E and, as such, the thickness of the second layer 145 is determined to be 10 to 27 nm in embodiments of the disclosure, taking light extraction into consideration. In this case, the first layer 140, which is transparent and is disposed over the second layer 145, allows light emerging from the second layer 145 to be emitted without any interference. In this regard, it is desirable that the thickness of the second layer 145 be 30 to 120 nm. In this case, the second layer 145 may be made of an alloy of Ag and Mg, an alloy of Ag and Yb, or an alloy of Ag, Mg and Yb.

Hereinafter, the reason why the above-described thickness ranges are selected when the first layer 140 in the transmissive electrode structure is made of a transparent electrode material and the second layer 145 is made of a reflective transparent electrode material will be described with reference to the following Tables 3 and 4.

Experimental examples of Table 3 are comparative examples, and represent efficiencies and color coordinates in a blue emission zone B_E determined when a transmissive electrode structure, namely, a cathode, is made of indium zinc oxide (IZO) while having a thickness of 300 Å and under the condition that the thickness of a hole transport layer disposed beneath a light emitting layer is varied. Experimental examples of Table 4 are examples to which the case (2) in each of the first and second embodiments of the present disclosure is applied, and represent efficiencies and color coordinates in a blue emission zone B_E determined when the second layer 145 in the transmissive electrode structure 1400 is made of AgMg while having a thickness of 140 Å and the first layer 140 in the transmissive electrode structure 1400 is made of IZO while having a thickness of 300 A and under the condition that the thickness of the hole transport layer disposed beneath the light emitting layer is varied.

TABLE 3

| | Cathode-IZO (300 Å) | | | |
|---|---|---|---|---|
| Example | Thickness of Hole Transport Layer (nm) | Efficiency (%) | CIEx | CIEy |
| 13 | 10 | 32.0 | 0.137 | 0.088 |
| 14 | 20 | 55.4 | 0.134 | 0.097 |
| 15 | 30 | 78.2 | 0.132 | 0.107 |
| 16 | 40 | 94.7 | 0.131 | 0.117 |
| 17 | 50 | 101.8 | 0.130 | 0.131 |
| 18 | 60 | 99.8 | 0.129 | 0.150 |
| 19 | 70 | 90.3 | 0.127 | 0.179 |
| 20 | 80 | 77.0 | 0.126 | 0.215 |

TABLE 4

| | Cathode-AgMg (140 Å)/IZO (300 Å) | | | |
|---|---|---|---|---|
| Example | Thickness of Hole Transport Layer (nm) | Efficiency (%) | CIEx | CIEy |
| 21 | 10 | 15.0 | 0.142 | 0.057 |
| 22 | 20 | 33.9 | 0.141 | 0.056 |
| 23 | 30 | 64.2 | 0.139 | 0.059 |
| 24 | 40 | 97.7 | 0.133 | 0.072 |
| 25 | 50 | 114.5 | 0.123 | 0.107 |
| 26 | 60 | 117.4 | 0.110 | 0.108 |
| 27 | 70 | 111.8 | 0.101 | 0.292 |
| 28 | 80 | 94.4 | 0.113 | 0.403 |

Referring to results of Table 3, it can be seen that, when a cathode in a display device is made of IZO, the value of color coordinate CIEy is greater than the CIEy value of 0.072. This means that, when emission of blue light is embodied, emission of pure blue is difficult, and blue is changed to a color having a longer wavelength, and, as such, the changed color is displayed. That is, this means that, when IZO alone is used for a cathode in order to secure transparency of a transparent display device, it may be difficult to achieve display of pure colors, and the color gamut expressing colors in the display device is reduced. In addition, it may be expected that, when a cathode is formed using only a single IZO layer, it may be difficult to realize expression of a color at a uniform color purity through application of the same dopant to the associated light emitting zone, even though the thickness of a hole transport layer is adjusted. In order to eliminate such a problem, in the display device of the present disclosure, AgMg is used for the second layer 145, which has reflective transparency, IZO is used for the first layer 140, which is a transparent electrode, and the reflective transparent second layer 145 made of AgMg is disposed at at least the emission part, and, as such, a CIEy value corresponding to the value of 0.072 representing pure blue may be derived, as in the experimental example 24.

In addition, when the experimental example 24 of Table 4 is compared with the experimental example 4 of Table 1, it can be seen that no or little efficiency degradation is exhibited in that the efficiency difference between the experimental example 24 and the experimental example 4 is 2.8%. That is, the experimental examples are examples to which the case (2) in each of the first and second embodiments of the present disclosure is applied and in which the second layer 145 in the transmissive electrode structure 1400 is made of AgMg while having a thickness of 140 Å and the first layer 140 is made of IZO while having a thickness of 300 Å. When the transmissive electrode structure 1400 is formed to have a double layer structure, as described above, the second layer 145 is patterned to be removed from the transmission part T and, as such, there may be an advantage in that transparency is maintained, as compared to the experimental examples of Table 1.

Although the experimental examples have been described with reference to blue, the same problems as described above may also occur in association with other colors when a cathode having a single reflective transparent electrode structure or a single transparent electrode structure is used for both the transmission part and the emission part. On the other hand, the display device of the present disclosure is significant in that transparency is enhanced at the transmission part, and both efficiency and color purity are secured at the emission part, through different cathode structures (transmissive electrode structures) at the transmission part and the emission part, and, as such, problems occurring in general transparent display devices are eliminated.

Meanwhile, the display devices according to the first and second embodiments of the present disclosure differ from each other in terms of different applications of the second layer 145 in the transmissive electrode structure 1400 to the emission part E and the transmission part T. The second layer 145 may be formed by selectively depositing a translucent metal or a translucent metal alloy on the substrate 100 using a mask opening a region corresponding to at least the emission part E such that the translucent metal or the translucent metal alloy is deposited in the opened region and, as such, the second layer 145 may be selectively formed at the emission part E, except for the transmissive part T. The second layer 145 may have a minimum area corresponding to an area where light is directly emitted from the emission part E, for example, an area where the organic light emitting layers 131, 132 and 133 are formed. In addition, the second layer 145 may have a maximum area corresponding to an area of the entirety of the active area, except for the transmission part T. In this case, when the second layer 145 has the maximum area, the area where the second layer 145 is disposed corresponds to a sum of the area where the different organic light emitting layers 131 and 132 and 133 are formed and the area where a bank 120 (FIGS. 3A and 3B) is formed as a boundary between the emission part E and the transmission part T.

Meanwhile, the active area AA in the display device of the present disclosure is an area of the substrate 100 where pixels P are disposed, and includes emission parts E, transmission parts T, and areas where banks 120 are formed between adjacent ones of the emission parts E and the transmission parts T, respectively. A pad part may be disposed outside the active area of the substrate 100. The pad part may be provided to correspond to one side of the substrate 100 or a plurality of sides of the substrate 100. The pad part includes pad electrodes and connecting lines connected to the pad electrodes. The pad part may be shielded by a tape or film made of a light shielding material or an enclosure.

Hereinafter, the configuration of the transmissive part T will be described. The transmissive part T may include the first layer 140 without including the second layer 145, as compared to a vertical lamination structure of the emission part E including the first electrodes 110 and the transmissive electrode structure 1400 laminated over the first electrodes 110 while including the first layer 140 and the second layer 145. In some cases, the transmissive part T may only include the first layer 140 without the second layer 145. In this case, although the single first layer 140 present as the configuration of the transmissive part T is transparent or translucent in accordance with the material thereof, the single first layer 140 is very thin and, as such allows free transmission of light therethrough. In accordance with provision of the transmissive part T as described above, the display device of the present disclosure may enable transparent display. In order to enhance transmissivity in transparent display, an encapsulation layer disposed over the transmissive electrode structure 1400 to take part in encapsulation of organic light emitting elements OLEDs or a polarization plate provided at a counter substrate may be eliminated.

Meanwhile, when an organic common layer is further included in the organic light emitting elements OLED in addition to configurations selectively patterned through a mask, for example, the organic light emitting layers 131, 132 and 133, the organic common layer may be formed to extend up to the transmission part T.

Although the vertical region between the first layer 140 and the substrate 100 is shown as being empty in FIGS. 1 and 2, which schematically show configurations, the transmission part T is formed in an organic light emitting element formation process, simultaneously with the organic light emitting elements OLED. The transmission part T may have an upper surface disposed at a lower level than an upper surface of the emission part E because the transmission part T does not have the organic light emitting layers 131, 132 and 133, and the second layer 145, as compared to the emission part E. This will be described later with reference to a cross-sectional view of FIG. 8. Upon embodying a practical device according to each of the embodiments of FIGS. 1 and 2, an organic common layer fills a space between the first layer 140 and the substrate 100 at the transmission part T and, as such, the first layer 140 may substantially contact the organic common layer. Furthermore, although FIG. 1 shows a space between the first layer 140 and the capping layer 160, in order to show that the first layer 140 extends over both the emission part E and the transmission part T, the capping layer 160 may directly contact the first layer 140 at the transmission part T. If necessary, the first layer 140 may contact, at a lower surface thereof, an inorganic common layer made of LiF or the like and formed for electron injection, in addition to the organic light emitting layers or the organic common layer.

In addition, the capping layer 160, which is made of a transparent organic material, is formed over the transmissive electrode structure 1400, to protect the transmissive electrode structure 1400, to enhance light extraction, and to secure reliability against external light. Here, reliability against external light means prevention of variations possibly occurring with passage of time in the organic light emitting elements due to ultraviolet (UV) light as well as visible light.

Hereinafter, examples of the transmission electrode structures in the display devices according to the first and second embodiments of the present disclosure will be described.

Figure 3A:
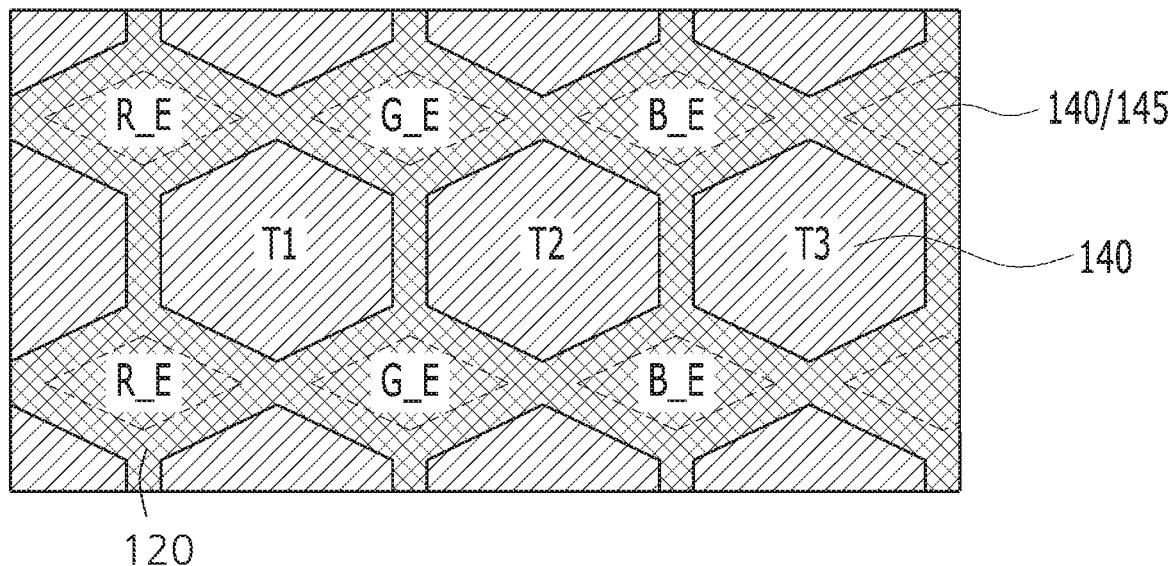
FIGS. 3A and 3B are plan views illustrating examples of the transmissive electrode structure in the display device according to the first and second embodiment of the present disclosure, respectively.
Figure 3B:
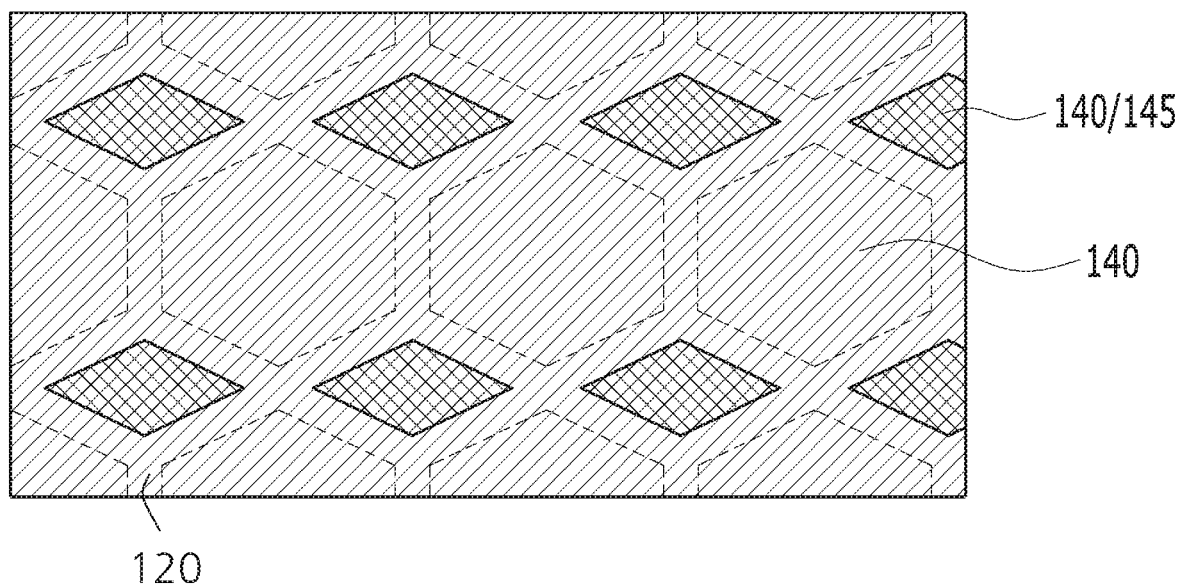

FIGS. 3A and 3B are plan views illustrating examples of the transmissive electrode structure in the display device according to the first and second embodiment of the present disclosure, respectively. The following examples are examples of the transmissive electrode structure, which may be included in either the first embodiment or the second embodiment.

In the first example of the transmissive electrode structure 1400 in FIG. 3A, the area where both the first layer 140 and the second layer 145 are laminated corresponds to an area portion of the active area in the substrate except for transmission parts T (T1, T2 and T3). In this example, the laminated structure of the first and second layers 140 and 145 is not limited to a core portion corresponding to emission parts E (R_E, G_E and B_E), but is further extended to include a connecting portion or section in an area between the emission parts E (R_E, G_E and B_E) and the transmission parts T (T1, T2 and T3). As such, the double-layer structure of the first and second layers 140 and 145 is formed to have continuance in the form of a matrix in a plane. In this case, the first layer 140 is formed over the entirety of the active area, and the second layer 145 is formed over the active area, except for the transmission parts T (Ti, T2 and T3). That is, the second layer 145 includes an area where a bank 120 (FIG. 7A) is formed to shield lines or the like disposed between the transmission parts T (T1, T2 and T3) and the emission parts E (R_E, G_E and B_E) such that the second layer 145 is disposed at not only the emission parts E (R_E, G_E and B_E), but also the bank area. The second layer 145 may be formed by depositing an electrode material for formation of the second layer using a deposition mask having opening portions corresponding to second layer formation areas of FIG. 3A (the emission parts each having a diamond shape and the connecting section to connect the emission parts).

In the second example of the transmissive electrode structure 1400 in FIG. 3B, the area where both the first layer 140 and the second layer 145 are laminated corresponds to the emission parts E (R_E, G_E and B_E). In this case, at the remaining area portion of the active area except for the emission parts E (R_E, G_E and B_E), the first layer 140 may be disposed as a single layer. In some case, only the first layer 140 may be disposed as a single layer. In this case, the second layer 145 may be formed by depositing an electrode material for formation of the second layer using a deposition mask having opening portions corresponding to second layer formation areas of FIG. 3B (the emission parts each having a diamond shape).

In either example as described above, the first layer 140 of the transmissive electrode structure 1400 is formed over the overall pixels and, as such, a uniform potential is secured. In this case, the second layer 145, which is made of a translucent electrode material exhibiting high conductivity for at least the emission parts E (R_E, G_E and B_E), is formed to have a predetermined thickness, even when the first layer 140 has a small thickness or is made of a translucent electrode material or a transparent oxide electrode material exhibiting high resistance. Accordingly, it may be possible to eliminate nonuniformity of brightness possibly occurring in a large-area cathode.

Furthermore, in accordance with provision of the second layer 145, which is made of a translucent electrode material for at least the emission parts E (R_E, G_E and B_E), it may be possible to enhance the light extraction efficiency of the transmissive electrode structure 1400 through Fabry-Perot reflective interference occurring at the area corresponding to the second layer 145. In addition, the transmission part T is provided with a translucent electrode or a transparent electrode which is constituted by a single layer while having a small thickness and, as such, it may be possible to enhance transmissivity in transparent display.

If necessary, the second layers 145 in the first and second embodiments may not be limited to arrangements of FIGS. 3A and 3B, respectively. Each second layer 145 may be disposed to overlap with the emission parts E (R_E, G_E and B_E) and a part of the area between the emission parts E (R_E, G_E and B_E) and the transmission parts T (T1, T2 and T3). Alternatively, each second layer 145 may have different overlap areas around the emission parts E (R_E, G_E and B_E) of different colors.

Figure 4:
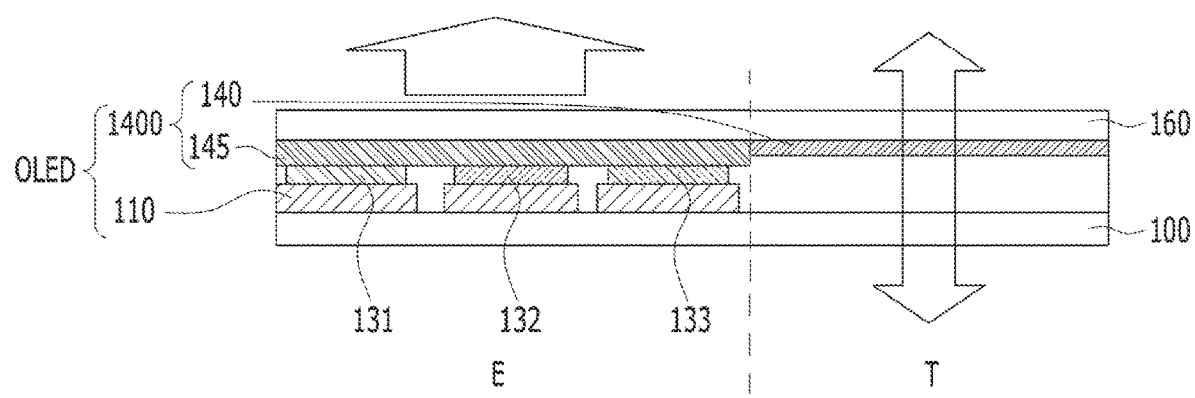
FIG. 4 is a cross-sectional view schematically illustrating the principle of a display device according to a third embodiment of the present disclosure.
Figure 5:
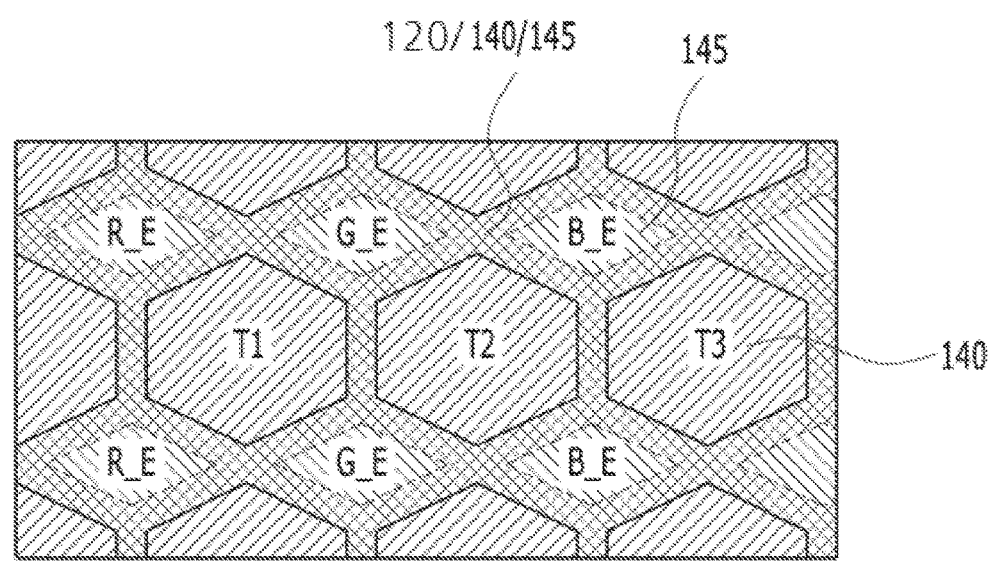
FIG. 5 is a plan view illustrating an example of a transmissive electrode structure in the display device according to the third embodiment of the present disclosure.

FIG. 4 is a cross-sectional view schematically illustrating the principle of a display device according to a third embodiment of the present disclosure. FIG. 5 is a plan view illustrating an example of a transmissive electrode structure in the display device according to the third embodiment of the present disclosure.

As illustrated in FIGS. 4 and 5, in the transmissive electrode structure 1400 in the display device according to the third embodiment of the present disclosure, the second layer 145 made of a translucent metal or a translucent alloy may be disposed at the emission part E, and the first layer 140 made of a transparent electrode material may be disposed at the transmission part T. In some cases, as shown in FIGS. 4 and 5, the second layer 145 made of a translucent metal or a translucent alloy is disposed only at the emission part E, and the first layer 140 made of a transparent electrode material is disposed only at the transmission part T. The third embodiment differs from the first and second embodiments in that both the first layer 140 and the second layer 145 are patterned in the active area AA of the substrate 100.

As illustrated in FIG. 5, the substrate 100 includes a plurality of pixels disposed in the active area AA. Each pixel includes a plurality of emission parts E (R_E, G_E and B_E) to emit different colors, and transmission parts T (T1, T2 and T3) spaced apart from the emission parts E (R_E, G_E and B_E). A bank 120 is disposed in an area between adjacent ones of the emission parts E (R_E, G_E and B_E) and an area between adjacent ones of the emission parts E (R_E, G_E and B_E) and the transmission parts T (T1, T2 and T3) and, as such, may divide areas respectively corresponding to the emission parts E (R_E, G_E and B_E) and the transmission parts T (T1, T2 and T3).

In addition, the display device includes organic light emitting layers 131, 132 and 133 disposed on the substrate 100 in the emission parts E (R_E, G_E and B_E), a reflective electrode structure 110 disposed between each of the organic light emitting layers 131, 132 and 133 and the substrate 100 in a corresponding one of the emission parts E (R_E, G_E and B_E), and a transmissive electrode structure 1400 including a first layer 140 disposed on the substrate 100, to correspond to the transmission parts T (T1, T2 and T3) and a second layer 145 disposed on the substrate 100, to correspond to the emission parts E (R_E, G_E and B_E).

In this case, the first layer 140 is made of a transparent electrode material, and the second layer 145 is made of a translucent metal or a translucent alloy. As illustrated in FIG. 5, the first layer 140 and the second layer 145 may overlap with each other in areas where the bank 120 is disposed, that is, areas between adjacent ones of the emission parts E (R_E, G_E and B_E) and between adjacent ones of the emission parts E (R_E, G_E and B_E) and the transmission parts T (T1, T2 and T3). As illustrated in FIG. 5, the overlap areas of the first and second layers 140 and 145 may overlap with the overall portion of the bank 120 or a portion of the bank 120. In this case, the emission parts E (R_E, G_E and B_E) and the transmission parts T (T1, T2 and T3) are provided with the second layer 145 and the first layer 140 as single layers, respectively, as illustrated in FIG. 4.

In the display device according to the third embodiment of the present disclosure as described above, the transmissive electrode structure 1400 is constituted by forming the first layer 140 at the transmission parts T (Ti, T2 and T3) using a transparent metal in order to enhance transmissivity and forming the second layer 145 at the emission parts E (R_E, G_E and B_E) using a translucent metal or a translucent alloy such that the second layer 145 has a predetermined thickness, taking into consideration a cavity-based optimal resonance efficiency. The first layer 140 may be formed to have a thickness of 30 to 120 nm, using a transparent oxide containing at least one metal selected from indium (In), titanium (Ti), zinc (Zn) and tin (Sn). The second layer 145 may be formed to have a thickness of 10 to 27 nm, using a metal selected from Ag, Mg and Yb or an ally selected from an alloy of Ag and Mg, an alloy of Ag and Yb and an alloy of Ag, Mg and Yb.

The second layer 145 at the emission parts E has a single layer structure. When the second layer 145 has a thickness of 10 to 27 nm, it may be possible to obtain an optimal cavity for all of red, green and blue. For example, when the second layer 145, which is formed alone in the emission parts E, as a reflective transparent electrode, has a thickness less than 10 nm, film formation stability may be degraded and, as such, it may be incapable of stably obtaining a desired light extraction efficiency due to surface nonuniformity at the emission parts E. On the other hand, when the thickness of the second layer 145 exceeds 27 nm, the long-wavelength efficiency of the cavity may be relatively increased and, as such, nonuniformity of white balance may become severe. Therefore, the thickness of the second layer 145 is determined to be 10 to 27 nm in embodiments of the disclosure.

Meanwhile, the display device according to the third embodiment of the present disclosure differs from those of the first and second embodiments in terms of whether or not the first layer 140 is patterned, and the remaining matters not described in association with the display device according to the third embodiment are identical to those of the first and second embodiments.

Figure 6:
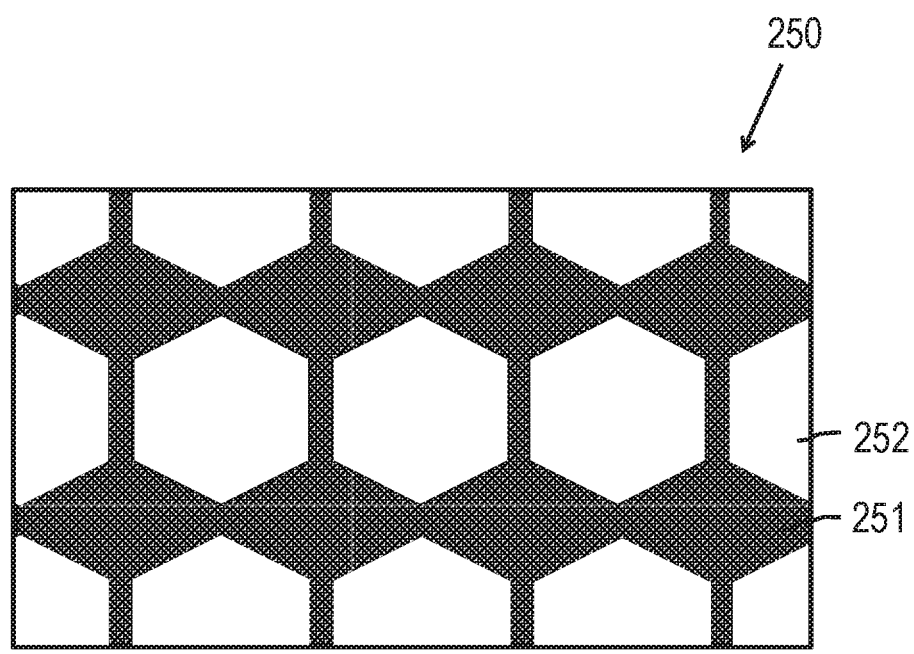
FIG. 6 is a plan view illustrating a mask for formation of a first layer in the display device according to the third embodiment of the present disclosure.

FIG. 6 is a plan view illustrating a mask for formation of the first layer in the display device according to the third embodiment of the present disclosure.

The mask, which is designated by reference numeral "250" in FIG. 6, is used to pattern the first layer 140. As illustrated in FIG. 6, the mask 250 has a structure including opening portions 252 respectively corresponding to the transmission parts T1, T2 and T3 of FIG. 5, and shielding portions 251 respectively corresponding to remaining regions. Each opening portion 252 may have a size accurately corresponding to the size of a corresponding one of the transmission parts T1, T2 and T3, or may extend to the bank around the corresponding transmission part such that the opening portion 252 overlaps with the bank. In either case, the opening portions 252 are adapted to selectively deposit a transmissive transparent electrode material on the transmission parts T1, T2 and T3, and do not overlap with the emission parts R_E, G_E and B_E.

The second layer 145 in the display device according to the third embodiment may be patterned using a mask having the same structure as the masks of the first and second embodiments having opening portions respectively corresponding to the emission parts R_E, G_E and B_E. This will be described later with reference to FIG. 9E.

Meanwhile, in the display device according to the third embodiment, there are advantages in that the transmission parts T, at which the first layer 140 having a light transmission property is formed, may secure transparency, and the emission parts E, at which the second layer 145 having translucency is formed to a thickness determined taking into consideration optimal microresonance and optimal light extraction, may secure a sufficient light emission efficiency and color purity corresponding to those of the experimental examples in Table 1.

Meanwhile, the substrate 100 including a plurality of pixels P in each of the above-described embodiments is made of a transparent material allowing transmission of light therethrough, as in a glass substrate or a plastic substrate. When the display device is employed in a flexible device, the substrate may be formed to be flexible, through adjustment of the thickness thereof.

Hereinafter, various planar layouts of the display device according to the present disclosure will be described.

Figure 7A:
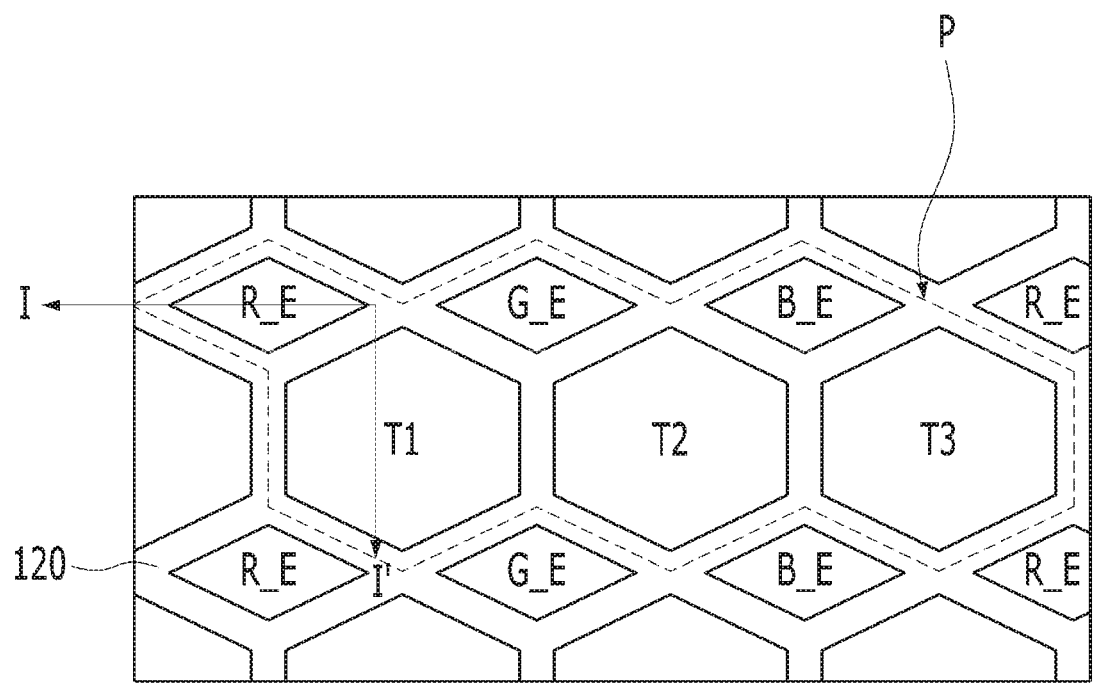
FIGS. 7A to 7C are plan views illustrating various planar arrangements of emission parts and transmission parts in the display device according to the present disclosure.
Figure 7B:
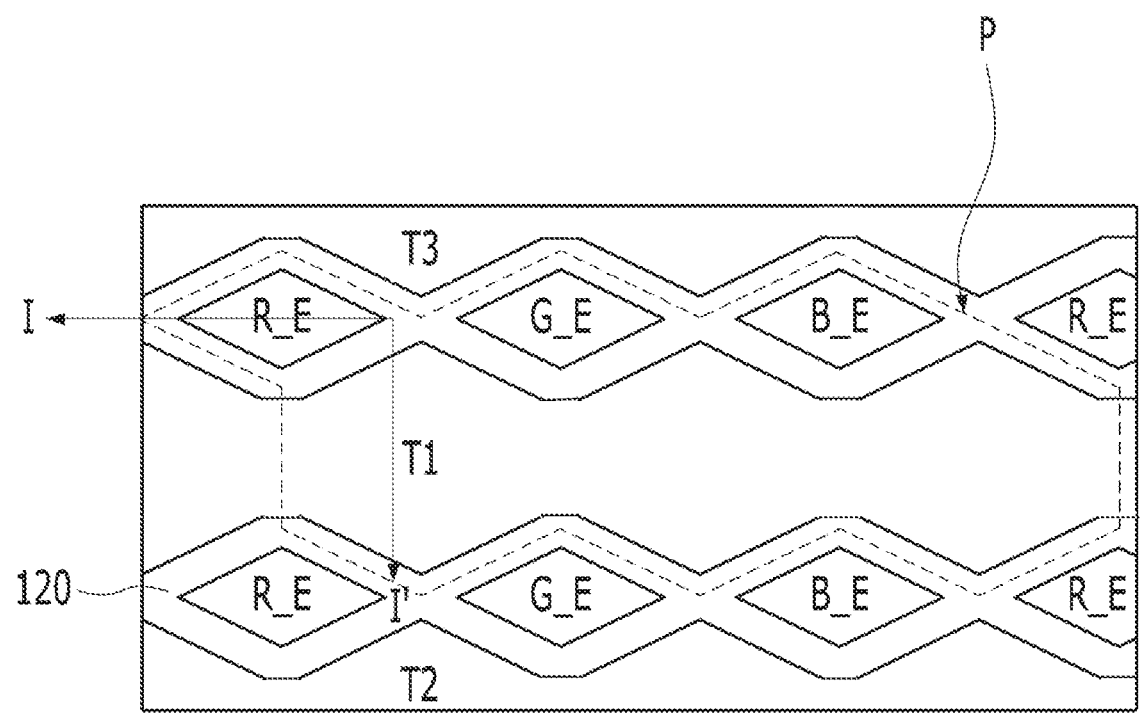
Figure 7C:
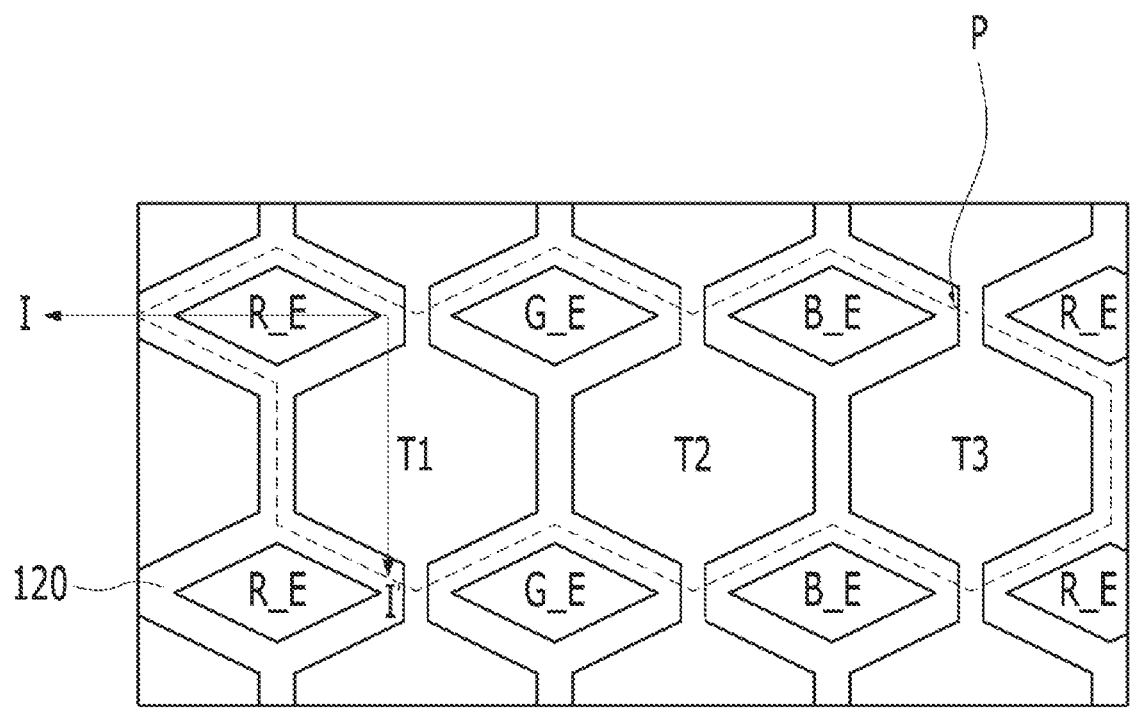

FIGS. 7A to 7C are plan views illustrating various planar arrangements of emission parts and transmission parts in the display device according to the present disclosure.

FIG. 7A illustrates an example of the display device of the present disclosure in which each pixel P includes first to third emission parts R_E, G_E and B_E for emitting different colors, and transmission parts T1, T2 and T3 disposed adjacent to the first to third emission parts R_E, G_E and B_E. The first to third emission parts R_E, G_E and B_E and the transmission parts T1, T2 and T3 are divided from one another by banks 120 formed to have a predetermined height. The banks 120 are formed to have a thickness of 1 to 5 μm such that the banks 120 are thicker than organic layers in organic light emitting elements OLED. The first to third emission parts R_E, G_E and B_E and the transmission parts T1, T2 and T3 are defined in regions surrounded by the banks 120.

Reflective electrode structures 110 as described above are disposed at areas corresponding to the first to third emission parts R_E, G_E and B_E, respectively. In detail, the reflective electrode structures 110 are provided at the first to third emission parts R_E, G_E and B_E, respectively, while being spaced apart from one another. The reflective electrode structures 110 may extend over not only the first to third emission parts R_E, G_E and B_E, but also the banks 120 disposed around the first to third emission parts R_E, G_E and B_E.

Although the pixel P is illustrated in FIG. 7A as including even the transmission parts T1, T2 and T3, the transmission parts T1, T2 and T3 are areas allowing passage of light therethrough rather than enabling expression of an image. In this regard, the transmission parts T1, T2 and T3 are areas where no current driving is carried out, and a uniform potential is maintained in accordance with provision of the first layer 140 of the transmissive electrode structure 1400. At the transmission parts T1, T2 and T3, there is no configuration of the reflective electrode structures 110. The transmission parts T1, T2 and T3 correspond to areas where the banks 120 surrounding the first to third emission parts R_E, G_E and B_E are not formed.

Light emitted from the first to third emission parts R_E, G_E and B_E may be red, green and blue. Of course, other color combinations may be possible, so long as the combined colors may create white. For example, a combination of cyan, magenta and yellow may be possible. Alternatively, a white light emitting element may further be provided in addition to red, green and blue light emitting elements. Multi-color light emitting elements of 3 colors or 4 colors or more may also be provided. Of course, the present disclosure is not limited to the above-described configurations. For example, first and second light emitting elements for emitting two different colors for color display may also be configured.

As illustrated in FIG. 7B, in a first modified example of the display device according to the present disclosure, the transmission parts T1, T2 and T3 are connected to extend lengthily without being spaced apart from one another in a horizontal direction. In this configuration, the banks 120 disposed between adjacent ones of the transmission parts, which are formed to have an island shape in the configuration of FIG. 7A, are eliminated such that the areas, from which the banks are eliminated, are also used as transmission parts. In this case, there is an effect of enhancement in transmissivity, as compared to the configuration of FIG. 7A.

As illustrated in FIG. 7C, in a second modified example of the display device according to the present disclosure, the transmission parts T1, T2 and T3 are connected to extend lengthily without being spaced apart from one another in a vertical direction. In this configuration, the transmission parts T1, T2 and T3, which are spaced apart from one another in the vertical direction in the configuration of FIG. 7A, are connected. This configuration may be embodied by eliminating the banks from areas where the transmission parts T1, T2 and T3 are connected. In this case, each transmission part connecting area or portion, which extends between adjacent ones of the emission parts R_E, G_E and B_E, may have a smaller width, as compared to the transmission parts T1, T2 and T3 having a great width. Each of the transmission parts T1, T2 and T3 may be parallel to those of the emission parts R_E, G_E and B_E disposed adjacent thereto.

If necessary, in a third modified example of the display device according to the present disclosure, the display device may include both the transmission part connecting portions in the first modified example and the transmission part connecting portions in the second modified example and, as such, the transmission parts may be connected in both the horizontal direction and the vertical direction. This configuration may be embodied by eliminating the banks corresponding to the connecting portions.

The reason why the banks 120 are eliminated from areas corresponding to the transmission parts T in the display device of the present disclosure is to avoid loss of transmissivity in the transmission parts caused by the banks 120, which is thickly formed using an organic material. In addition, the reflective electrode structures 110 and the organic light emitting layers are not disposed in the areas corresponding to the transmission parts T. As a result, the transmission parts T may function as a kind of transparent film allowing one of top and bottom sides to be viewed without an obstacle when viewed from the other of the top and bottom sides, without voltage-on/off control.

Hereinafter, configurations of the emission parts E including thin film transistors TFT and the transmission parts T disposed adjacent to the emission parts E in the display device of the present disclosure will be described with reference to cross-sectional views.

FIG. 8 is a cross-sectional view taken along line I-I' in FIGS. 7A to 7C.

FIG. 8 concretely illustrates the configuration of FIG. 2 in the display device of the present disclosure. In particular, FIG. 8 illustrates the first emission part R_E and the transmission part T disposed adjacent thereto.

The configuration of FIG. 8 differs from the configuration of FIG. 2 in that the substrate 100 in the configuration of FIG. 8 is provided with thin film transistors TFT respectively connected to the reflective electrode structures 110 at the emission parts E (R_E, G_E and B_E in FIG. 7A), and banks 120 disposed between adjacent ones of the emission parts E and the transmission parts T (T1, T2 and T3) while being further provided with organic common layers CL for organic light emitting elements OLED.

In detail, each thin film transistor TFT includes an active layer 104 constituted by a semiconductor layer formed on the substrate 100, which includes a buffer layer 102, such that the semiconductor layer is disposed at a predetermined portion of a corresponding one of the emission parts E (R_E, G_E and B_E), a gate electrode 106 formed over the active layer 104, to overlap with a channel region of the active layer 104, under the condition that a gate insulating film 105 is interposed between the active layer 104 and the gate electrode 106, and a source electrode 108 and a drain electrode 109, which are connected to opposite sides of the active layer 104, respectively. The thin film transistor TFT may further include an interlayer insulating film 107 formed between a layer constituting the source electrode 108 and the drain electrode 109 and a layer constituting the gate electrode 106, except for regions where the source electrode 108 and the drain electrode 109 are connected to the active layer 104.

In addition, the source electrode 108 may be connected to the reflective electrode structure 110 of the corresponding organic light emitting element OLED. The reflective electrode structure 110 is connected to the source electrode 108 via a contact hole formed at a planarization film 115 for planarizing the thin film transistor TFT. The reflective electrode structure 110 is disposed on the planarization film 115 in an area corresponding to the corresponding emission part E ((R_E, G_E or B_E).

For example, the reflective electrode structure 110 may have a multilayer structure including a reflective electrode layer 110b. When the reflective electrode layer 110b is disposed as an intermediate layer of the multilayer structure, the reflective electrode structure 110 may be formed to have a triple-layer structure by disposing a first transparent electrode layer 110a and a second transparent electrode layer 110c beneath and over the reflective electrode layer 110b. Of course, the reflective electrode structure 110 is not limited to the above-described structures. The reflective electrode structure 110 may basically include the reflective electrode layer 110b, which is constituted by one or more layers, as a core, and a transparent electrode layer formed on and under the reflective electrode layer 110b, and as such, the reflective electrode structure 110 may have a structure including two or more layers. In practice, the reflective electrode structure 110 may have a multilayer structure in which reflective electrode layers and transparent electrode layers alternate.

The illustrated example shows that the reflective electrode structures 110 and the thin film transistors TFT overlap with not only the emission parts E (R_E, G_E and B_E), but also portions of the banks disposed between adjacent ones of the emission parts E (R_E, G_E and B_E) and between adjacent ones of the emission parts E (R_E, G_E and B_E) and the transmission parts T (T1, T2 and T3). In the display device of the present disclosure, accordingly, the configuration disposed beneath the banks 120 may be light-shielded because the reflective electrode structure 110 disposed beneath the banks 120 includes the reflective electrode layer 110b and, as such, the thin film transistors TFT and the reflective electrode structures 110 may have freedom of arrangement in areas except for the transmission parts T.

Meanwhile, the example of FIG. 8 illustrates that a first organic light emitting layer 131 is provided at an area corresponding to the first emission part R_E, and a first organic common layer 122 and a second organic common layer 126 are formed over and beneath the first organic light emitting layer 131, respectively. This example also illustrates that the first and second organic common layers 122 and 126 extend overly the transmission part. Ti. When the first and second organic common layers 122 and 126 are formed without using a deposition mask, the first and second organic common layers 122 and 126 are disposed in the active area without spacing.

As illustrated in FIG. 8, the first light emitting layer 131 may be formed at the first emission part R_E using a mask. Similarly, a second organic light emitting layer 132 (FIGS. 1 and 2) and a third organic light emitting layer 133 (FIGS. 1 and 2), which emit colors different from that of the first light emitting layer 131, may be selectively formed at the second emission part G_E and the third emission part B_E, respectively.

If necessary, vertical distances of the first to third light emitting layers 131, 132 and 133 from surfaces of the reflective electrode structures 110 may be different in order to obtain different resonance distances required in the reflective electrode structures 110 and the transmissive electrode structure 1400 for wavelengths of different colors to be emitted. This may be achieved by adjusting the thicknesses of the first to third emission layers 131, 132 and 133 to be different or additionally providing an auxiliary hole transport layer beneath the light emitting layer having a greater vertical distance from the corresponding reflective electrode structure 110 than the remaining ones of the light emitting layers 131, 132 and 133. For example, an auxiliary hole transport layer may be provided at the emission part to emit a color having a long wavelength. Alternatively, auxiliary hole transport layers may be provided at a plurality of emission parts, respectively. In this case, the auxiliary hole transport layer of the emission part to emit a color of a longer wavelength has a greater thickness than those of the remaining emission parts. Such an auxiliary hole transport layer is formed at a selected one of the emission parts. Accordingly, upon forming the organic light emitting layer of the selected emission part, the auxiliary hole transport layer may be formed using a mask for formation of the organic light emitting layer, and the organic light emitting layer is subsequently formed using the mask.

If necessary, a plurality of light emitting layers may be provided between the reflective electrode structure 110 and the transmissive electrode structure 1400 in association with each emission part E, in place of a single light emitting layer. In this case, the plural light emitting layers are present in a plurality of sub-stacks, respectively. The sub-stacks are divided from one another by charge generation layers. Each sub-stack is constituted by an organic layer. As described with reference to FIG. 4, organic common layers may be disposed beneath and over the light emitting layers. When a structure having a plurality of sub-stacks is applied to each emission part E, each transmission part T may be provided with the organic common layers and the charge generation layers, except for the light emitting layers.

As illustrated in FIG. 8, the transmissive electrode structure 1400 may include a second layer 145 selectively formed at the emission parts E, and a first layer 140 formed on the second layer 145 to cover all pixels of the substrate 100 including the emission parts E and the transmission parts T. Alternatively, the formation order of the first layer 140 and the second layer 145 may be reversed such that the first layer 140 and the second layer 145 may be formed in this order, as described with reference to FIG. 1.

In either case, the transmissive electrode structure 1400 functions as electrodes. The first layer 140 and the second layer 145 are in contact with each other.

In addition, as a modified example, the transmissive electrode structure 1400 may include a region where the first layer 140 is disposed while extending lengthily in one direction, that is, a horizontal direction or a vertical direction, in accordance with the shape of the transmission parts T1, T2 and T3 illustrated in FIG. 7B or 7C.

Hereinafter, a method for manufacturing the display device of the present disclosure will be described.

Figure 10A:
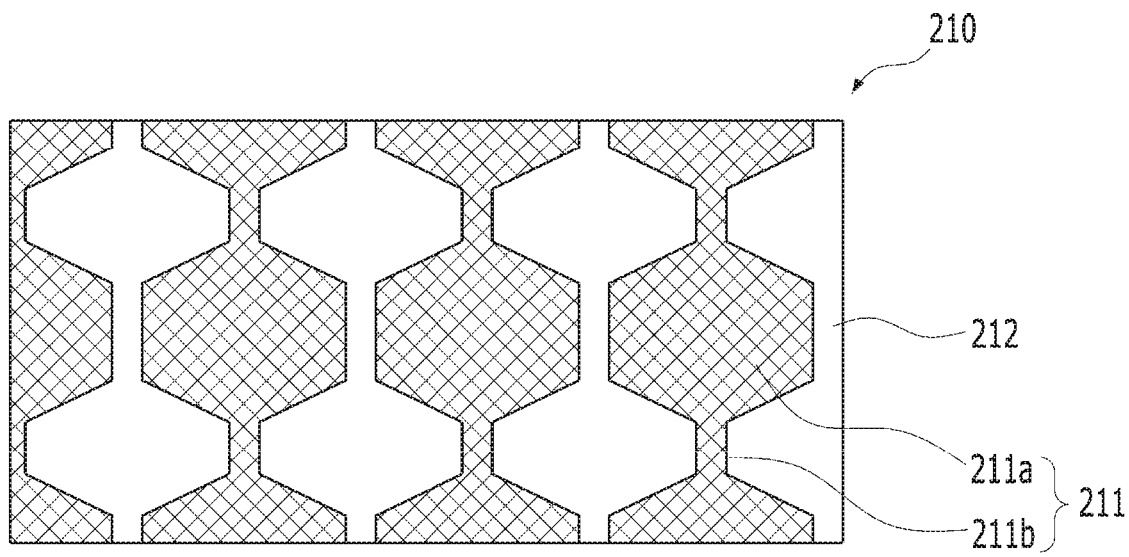
FIGS. 10A and 10B are plan views illustrating examples of a mask used in a process for forming a second layer of the transmissive electrode structure.
Figure 10B:
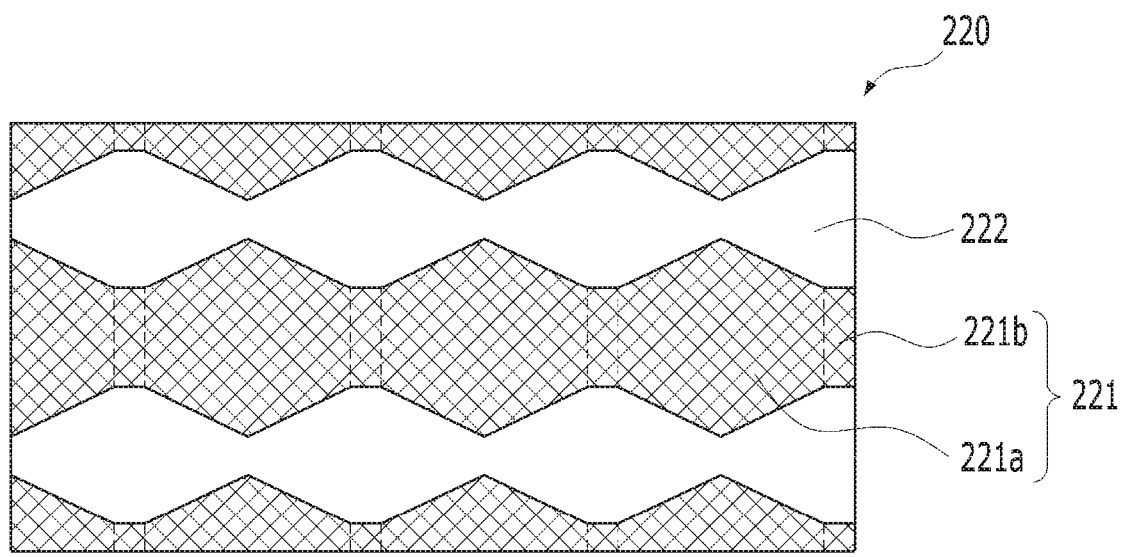
Figure 11:
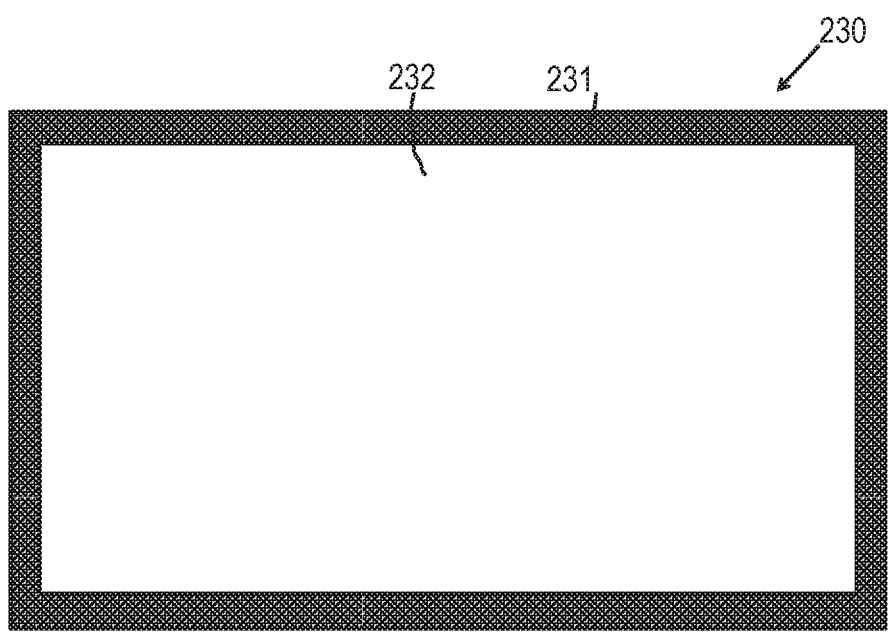
FIG. 11 is a plan view illustrating an example of a mask used in a process of FIG. 9F.

FIGS. 9A to 9G are cross-sectional views illustrating a method for manufacturing the display device according to the second embodiment of the present disclosure. FIGS. 10A and 10B are plan views illustrating examples of a mask used in a process for forming the second layer of the transmissive electrode structure. FIG. 11 is a plan view illustrating an example of a mask used in a process of FIG. 9F.

Figure 9A:
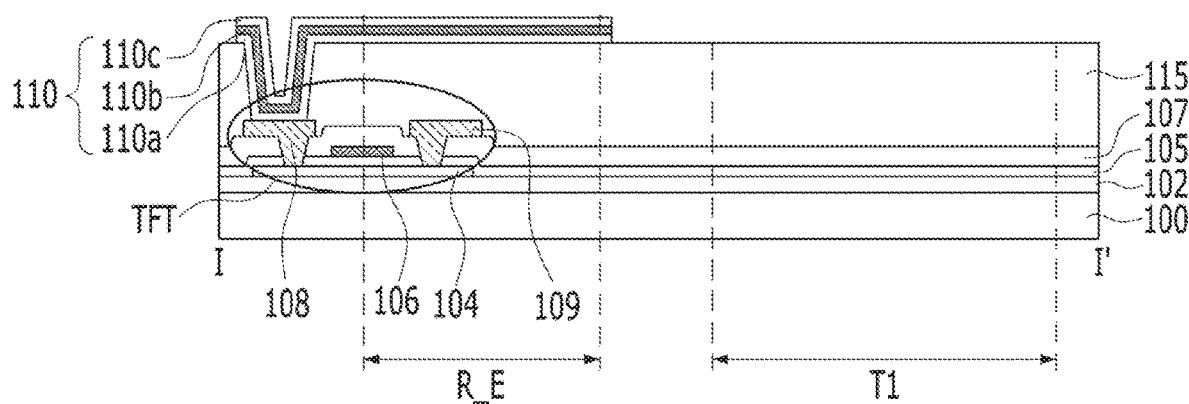
FIGS. 9A to 9G are cross-sectional views illustrating a method for manufacturing the display device according to the second embodiment of the present disclosure.

FIG. 9A illustrates a method for forming one thin film transistor TFT and one reflective electrode structure 110 in association with one emission part E (R_E) and one transmission part T (T1).

In accordance with the illustrated method, a buffer layer 102 is first formed over the substrate 100. Thereafter, a semiconductor layer 104 is formed on the buffer layer 102, to correspond to the emission part E, and a gate insulating film 105 is then formed over the entire upper surface of the resulting structure. A gate electrode 106 is subsequently formed on the gate insulating film 105, to overlap with a channel region of the semiconductor layer 104. An interlayer insulating film 107 is then formed to cover the gate electrode 106. The interlayer insulating film 107 and the gate insulating film 105 are then selectively removed to partially expose opposite portions of the semiconductor layer 104, thereby forming contact holes. Thereafter, a metal layer is formed over the interlayer insulating film 107 including the contact holes. The metal layer is selectively removed, thereby forming a source electrode 108 and a drain electrode 109.

Here, the semiconductor layer 104, the gate electrode 106, the source electrode 108 and the drain electrode 109 are collectively referred to as a "thin film transistor" TFT. The thin film transistor TFT may be formed to extend to an area beyond the emission part E, so long as the area excludes the transmission part T, because the thin film transistor TFT may be shielded by the reflective electrode structure 110 or a bank 120, which is formed thereover. In addition, the present disclosure is not limited to the case in which a single thin film transistor is formed at each emission part E. For example, a plurality of thin film transistors may be formed at each emission part E.

Thereafter, a planarization film 115 is formed over the entire surface of the resulting structure including the thin film transistor TFT. The planarization film 115 is then selectively removed to form a contact hole, through which the source electrode 108 is exposed.

Subsequently, a first transparent electrode layer 110*a*, a reflective electrode layer 110*b* and a second transparent electrode layer 110*c* are sequentially laminated over the planarization film 115 including the contact hole, and are then selectively removed to selectively form a reflective electrode structure 110 at the emission part E. The reflective electrode structure 110 is connected to the source electrode 108 via the contact hole. Similarly to the thin film transistor TFT, the reflective electrode structure 110 may be formed to extend to an area beyond the emission part E without being limitatively disposed within the emission part E, so long as the area excludes a transmission part T.

Although the reflective electrode structure 110 is illustrated as having a triple-layer structure, the reflective electrode structure 110 is not limited thereto. The reflective electrode structure 110 may include a reflective electrode layer, as a minimal basic configuration thereof, and may further include a transparent electrode layer formed on and under the reflective electrode layer. If necessary, the reflective electrode structure 110 may have a structure in which reflective electrode layers and transparent electrode layers alternate.

Figure 9B:
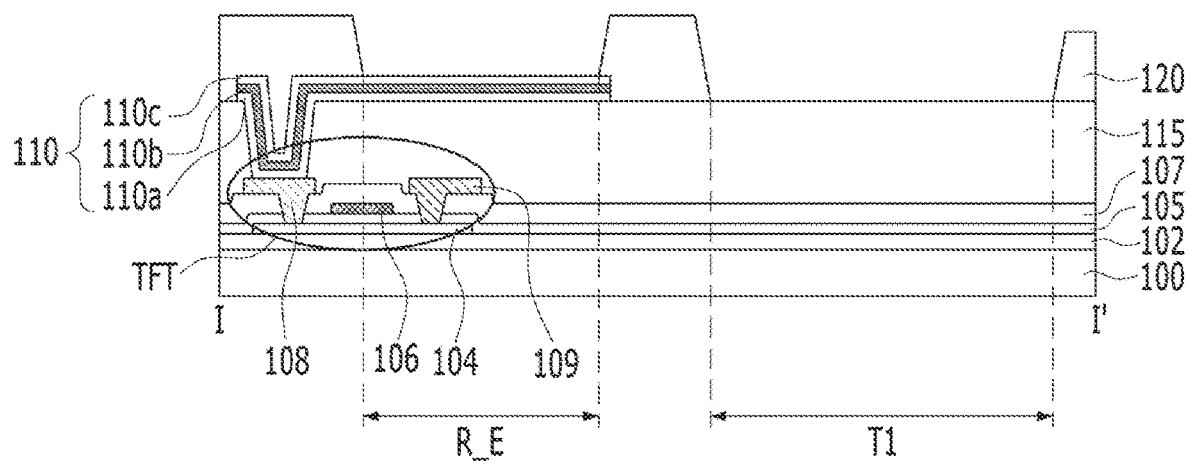

Thereafter, as illustrated in FIG. 9B, an organic material such as photoacryl, polyimide or polyamide is coated over the planarization film 115 including the reflective electrode structure 110, and is then selectively removed to form banks 120 for dividing emission parts R_E, G_E and B_E and transmission parts T1, T2 and T3.

The reflective electrode structure 110 is formed to correspond to the emission part E, as described above, and, as such, the planarization film 115 is not opened at the emission part E. In an area corresponding to the transmission part T defined by neighboring ones of the banks 120 as a boundary of the transmission part T, however, the planarization film 115 is opened at a portion thereof disposed between the neighboring banks 120.

Figure 9C:
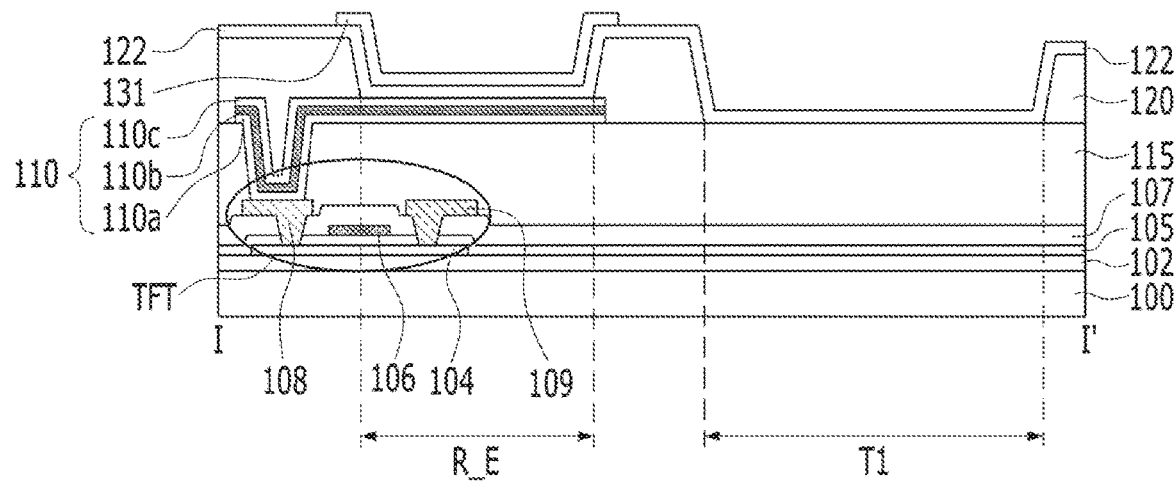

As illustrated in FIG. 9C, a first organic common layer 122 is then formed over the emission part E, the transmission part T and the banks 120. The first organic common layer 122 may include layers associated with transport of holes. For example, the layers may include a hole injection layer, a hole transport layer and an electrode blocking layer. These layers may be formed without using a mask.

Subsequently, a first organic light emitting layer 131, a second organic light emitting layer 132 (FIGS. 1 and 2), and a third organic light emitting layer 133 (FIGS. 1 and 2) are sequentially formed for the first to third emission parts R_E, G_E and B_E to emit different colors, using deposition masks (not shown), such that the first to third light emitting layers 131, 132 and 133 are spaced apart from one another. If necessary, an auxiliary hole transport layer may be further formed beneath at least one of the light emitting layers using the same mask as that of the light emitting layer, in addition to the first organic common layer 122, in order to adjust the height of the light emitting layer.

Figure 9D:
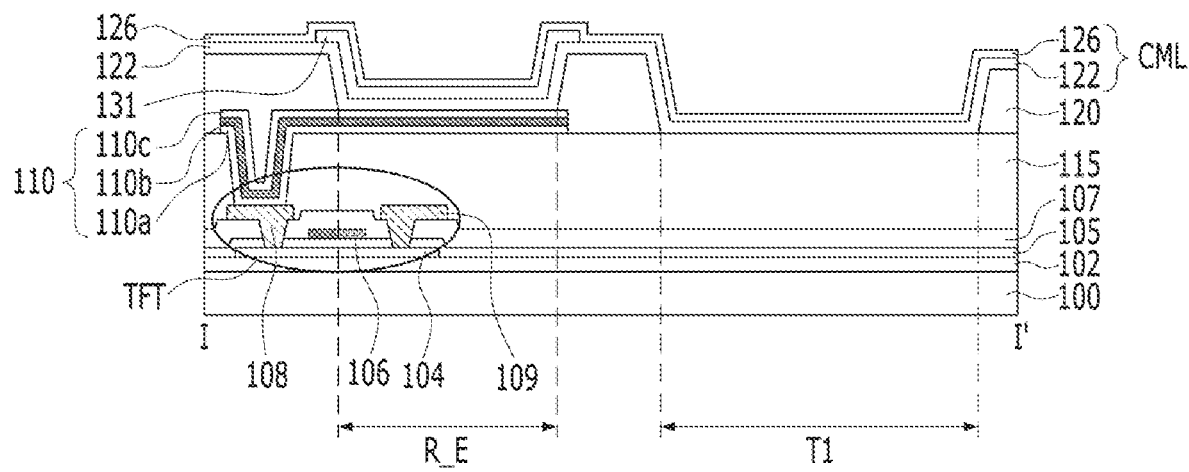

As illustrated in FIG. 9D, a second organic common layer 126 is then formed on the first organic light emitting layer 131, the second organic light emitting layer 132, the third organic light emitting layer 133 and the banks 120.

Here, the first organic common layer 122 and the second organic common layer 126 are layers formed over the pixels without division of the pixels, as inferred from the names thereof. These layers are common layers CIVIL. These layers may be formed without using a mask. Even in the case in which a mask is needed for formation of the first and second organic common layers 122 and 126, the mask may have a structure capable of shielding a peripheral portion of the active area such that all pixels are opened. A common mask may be used for the first and second organic common layers 122 and 126.

Figure 9E:
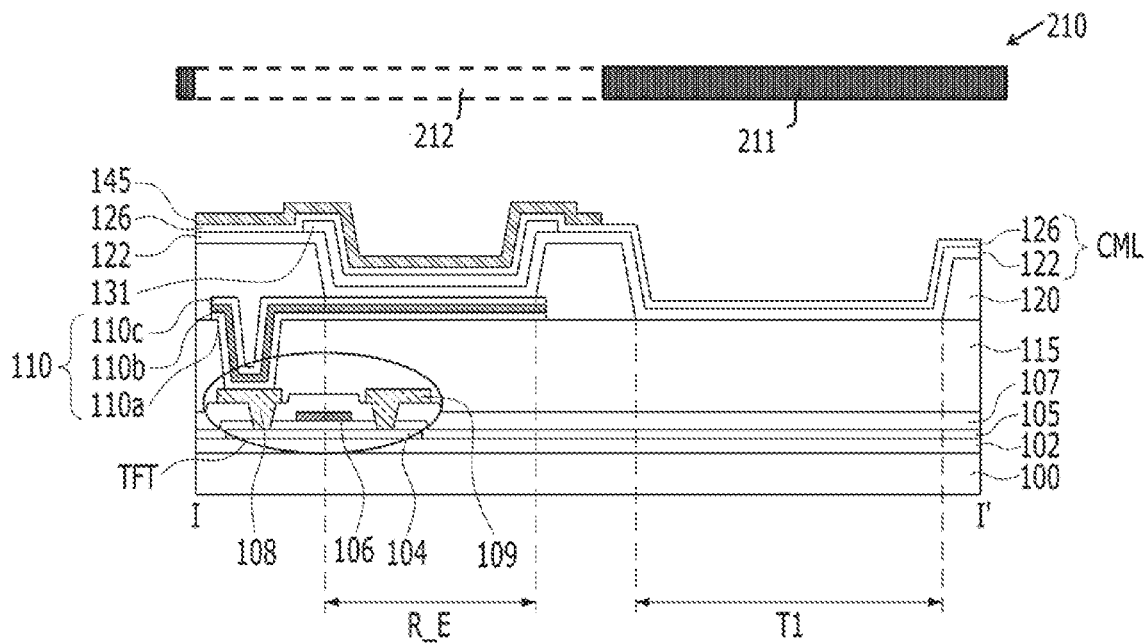

As illustrated in FIG. 9E, second layers 145 are then formed on the second organic common layer 126 to respectively correspond to the emission parts E (R_E, G_E and B_E) using a mask 210 (FIG. 10A) or 220 (FIG. 10B) having opening portions 212 (FIG. 10A) or 222 (FIG. 10B) for the emission parts E (R_E, G_E and B_E).

For example, the mask 210 of FIG. 10A has the opening portions 212, which allow passage of a deposition material therethrough while extending in a vertical direction, and shielding portions 211 disposed in regions except for the opening portions 212. In this case, the shielding portions 211 extend in the vertical direction in parallel to the arrangement direction of the opening portions 212. In this case, each shielding portion 211 includes a first shielding portion 211a having a great width, and a second shielding portion 211b connecting the first shielding portion 211a to the first shielding portion 211a of another shielding portion 211 disposed adjacent thereto while having a small width. When a translucent metal (alloy) is deposited on the second organic common layer 126 using the mask 210 of FIG. 10A as described above, the second layers 145 are selectively formed in accordance with the shape of the opening portions 212. The regions where the second layers 145 are formed may cover at least the emission parts E (R_E, G_E and B_E), which have an island shape. The materials of the second layers 145 are also formed substantially between adjacent ones of the emission parts E (R_E, G_E and B_E). However, emission parts are selectively formed in island-shaped regions, as illustrated in FIG. 7A or 7C, because no light is emitted through the banks 120 in the display device.

Meanwhile, the mask 220 of FIG. 10B has the opening portions 222, which allow passage of a deposition material therethrough while extending in a horizontal direction, and shielding portions 221 disposed in regions except for the opening portions 222. In this case, the shielding portions 221 extend in the horizontal direction in parallel to the arrangement direction of the opening portions 222. In this case, each shielding portion 221 includes a first shielding portion 221a having a great width, and a second shielding portion 221b connecting the first shielding portion 221a to the first shielding portion 221a of another shielding portion 221 disposed adjacent thereto while having a small width. When a translucent metal (alloy) is deposited on the second organic common layer 126 using the mask 220 of FIG. 10B as described above, the second layers 145 are selectively formed in accordance with the shape of the opening portions 222. The regions where the second layers 145 are formed may cover at least the emission parts E (R_E, G_E and B_E), which have an island shape. Although the second layers 145 are disposed on the banks 120 between adjacent ones of the emission parts E (R_E, G_E and B_E), similarly to the case using the mask 210 of FIG. 9A, emission parts are selectively formed in island-shaped regions, as illustrated in FIG. 7A or 7B, because no light is emitted through the banks 120 in the display device.

Figure 9F:
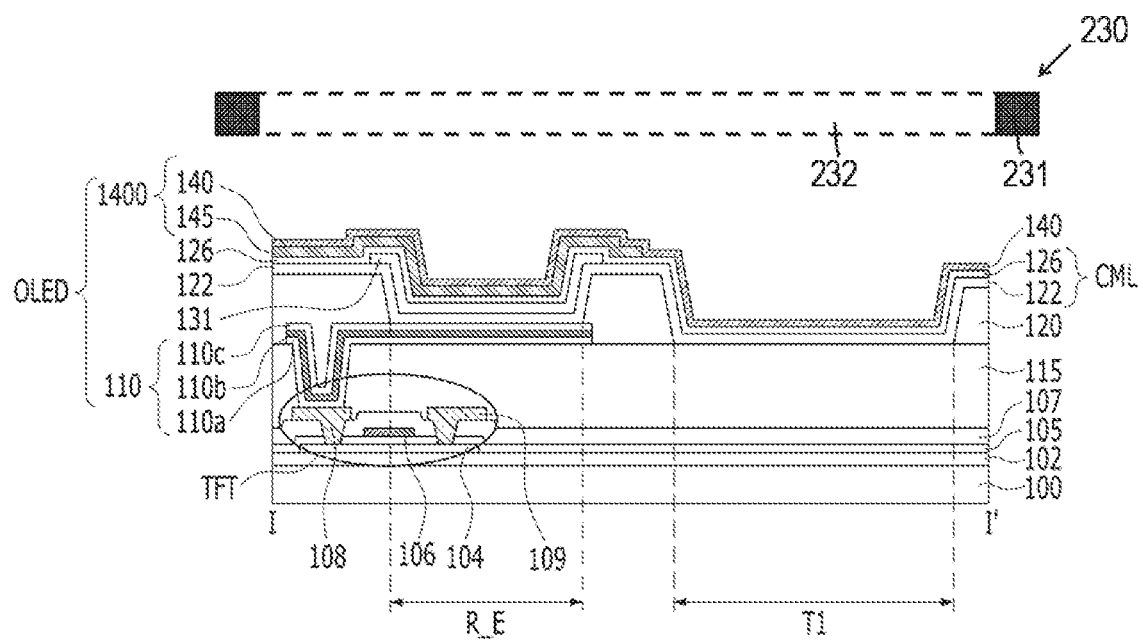

Subsequently, as illustrated in FIGS. 9F and 11, a first layer 140 is formed over all pixels (active area) using a mask 230 having an opening portion 232. The first layer 140 may be made of a translucent metal (alloy) or a transparent metal. In this case, the mask 230 has a shielding portion 231 at a portion thereof corresponding to an area of the substrate 100 except for the active area AA. The mask 230, which has the above-described structure, is also referred to as an "open mask" in that the mask 230 is open at a portion thereof corresponding to the active area AA.

Meanwhile, the formation order of the first layer 140 and the second layers 145 as illustrated in FIGS. 9E and 9F may be reversed. In either case, the first layer 140 and the second layers 145 are formed to contact each other. The first layer 140 formed over all pixels and the second layers 145 respectively formed at the emission parts E (R_E, G_E and B_E) constitute the transmissive electrode structure 1400.

Meanwhile, as illustrated in FIGS. 9E and 9F, the transmissive electrode structure 1400 is formed without using a photo process requiring light exposure and development or a stamp process, due to the following reason. The thickness of the first layer 140 and the total thickness of the first and second layers 140 and 145 should have predetermined values while being uniform, respectively, taking into consideration transmissivities of the first and second layers 140 and 145 and high brightness of the emission parts. Furthermore, the first and second layers 140 and 145 are deposited directly on an organic layer deposited at a low density in a vapor deposition manner. When a photo process or a stamp process is used for formation of the transmissive electrode structure 1400, the lower organic layer may be damaged during removal of a photoresist in the photo process or during separation of a stamper in the stamp process. For this reason, the photo process or the stamp process is not used in formation of the transmissive electrode structure 1400.

In the display device manufacturing method of the present disclosure, the first layer 140 and the second layers 145 are formed immediately after formation of the organic layers of the organic light emitting elements OLED (the first organic common layer 122, the first to third organic light emitting layers 131, 132 and 133 and the second organic common layer 126). Continuously to the process of depositing the organic layers, that is, continuously to formation of the second organic common layer 126, the first layer 140 and the second layer 145 are sequentially formed in this order or in a reversed order and, as such, deposition of the first layer 140 and the second layer 145 is carried out under the condition that the first layer 140 or the second layer 145 directly contacts the second organic common layer 126 without intervention of other materials therebetween. As the same deposition method is used for deposition of the organic layers and the first and second layers 140 and 145, interface characteristics between the second organic common layer 126 and the first layer 140 or the second layer 145 may be stabilized, and thicknesses of the transmissive electrode structure 1400 respectively required for each transmission part T and each emission part E may be stably maintained. In addition, since a separate photoresist removal process or a separate stamper separation process is not required after deposition of the first and second layers 140 and 145, it may be possible to avoid damage to the organic materials of the organic light emitting elements OLED due to use of the above-described process. Furthermore, high temperature is not required in the process of depositing the transmissive electrode structure 1400 and, as such, the organic light emitting elements OLED, which are weak against heat, are not degraded. Accordingly, reliability of the display device may be secured.

Figure 9G:
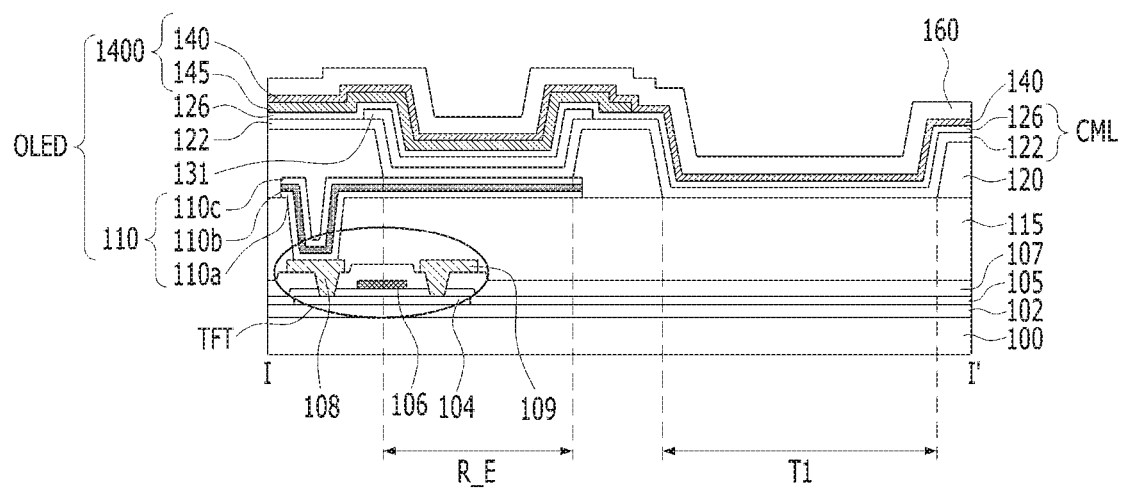

Thereafter, as illustrated in FIG. 9G, a capping layer 160 is formed over the transmissive electrode structure 1400. The capping layer 160 may be formed to have a greater area than the transmissive electrode structure 1400.

The display device of the present disclosure and the manufacturing method thereof as described above may have the following effects.

That is, in the display device of the present disclosure, the transmissive electrode structure has different configurations for at least each emission part and each transmission part such that the emission part has a relatively great thickness while being provided with a highly-conductive metal, to achieve an enhancement in light extraction efficiency, whereas a metal layer having a small thickness is left as a single layer at the transmission part, for transparent display, and, as such, there is no amount of light shielded by the metal layer at the transmission part.

In addition, in the display device of the present disclosure, there is no open region in the transmissive electrode structure. Furthermore, the transmissive electrode structure is provided with a highly-conductive metal at a portion thereof corresponding to at least each emission part. Accordingly, although the transmissive electrode structure is formed to have a great area, the transmissive electrode structure may secure a uniform potential and, as such, it may be possible to avoid a phenomenon in which the transmissive electrode structure exhibits a reduction in brightness at a specific portion thereof, that is, brightness nonuniformity.

In addition, through modification of the configuration in a top emission type organic light emitting display device, it may be possible to simultaneously secure emission parts having high brightness and transmission parts having high transmissivity. Accordingly, low-power, long-lifespan and highly-efficient driving of each emission part may be possible. As a result, a highly-functional transparent display device may be embodied.

Furthermore, the transmissive electrode structure may be formed to have double steps, without loss of materials, using masks having different open regions (opening portions) for the first layer and each second layer or masks selectively having opening portions for the second layers to be limitatively formed in regions corresponding to parts of pixels, respectively. Accordingly, it may be possible to embody a transmissive electrode structure having uniform double steps for each emission part and each transmission part without use separate equipment.

The display device of the present disclosure is provided with a transmissive electrode structure including a first layer having high transmissivity while extending over the emission parts and the transmission parts for a plurality pixels, and a second layer having high conductivity and translucency while being disposed in areas except for the transmission parts under the condition that the second layer contacts the first layer.

In the present disclosure, the first layer maintains a cathode function, and the second layers, which are disposed at at least the emission parts, reinforce cathode and microcavity characteristics, together with the first layer. Accordingly, a display device having enhanced performance at both each transmission part and each emission part may be embodied.

In addition, for each emission part, which is capable of performing on/off operation through application of a voltage, a reflective electrode structure including a lamination structure of a first layer and a second layer, which has high conductivity and reinforced cavity characteristics, is provided and, as such, the problem that emission parts, which have a small area due to provision of transmission parts in a transparent display, are driven at an increased voltage, may be solved. Accordingly, low-power driving of the emission parts may be achieved and, as such, lifespan of the display device may be increased.

A display device of another embodiment may comprise a substrate having an emission area and a transmission area, a reflective electrode structure at the emission area, an organic emitting layer over the reflective electrode structure and a transmissive electrode structure having a plurality of layers over the organic light emitting layer, wherein at least one layer among the plurality of layers of the transmissive electrode structure is located at the emission area and the transmission area, and at least the other layer among the plurality of layers is located at the emission area.

The other layer among the plurality of layers of the transmissive electrode structure may comprise core portions corresponding to respective emission areas, and connecting portions for connecting adjacent ones of the emission areas.

In the transmissive electrode structure, the other layer among the plurality of layers may have a metal having translucency; and the at least one layer among the plurality of layers may have a metal having transparency or translucency. In this case, the at least one layer and the other layer each comprise Ag and each of the at least one layer and the other layer further comprises at least one of Mg or Yb. And the at least one layer has a thickness of 4 to 12 nm and the other layer has a thickness of 6 to 15 nm.

The at least one layer may comprise a transparent oxide having at least one metal selected from indium, titanium, zinc and tin; and the other layer comprises two or more metals, at least one of the two or more metals is Ag, and the remaining metal of the two or more metals is a metal to prevent aggregation of Ag and having a work function equal to or lower than a work function of Ag.

Also, the other layer may be disposed nearer to the organic light emitting layer than the at least one layer.

The at least one layer may have a thickness of 30 to 120 nm and the other layer may have a thickness of 10 to 27 nm.

A display device of another embodiment may comprises a substrate having a plurality of pixels, each of the plurality of pixels including: an emission part and a transmission part, a reflective electrode structure overlying the substrate in the emission part; an organic light emitting layer overlying the reflective electrode structure; and a transmissive electrode overlying the organic light emitting layer, the transmissive electrode having a first layer overlying the transmission part and a second layer in contact with the first layer and overlying the emission part.

The first layer may comprise a transparent metal and the second layer comprises a translucent metal or translucent alloy.

The first layer may further overlie the emission part.

The first layer may overlie the second layer in the emission part or the second layer overlies the first layer in the emission part.

Furthermore, when the display device manufacturing method of the present disclosure is used, formation of the second layers in the transmissive electrode structure it may be achieved by selectively adjusting opening portions of the deposition mask for formation of the second layers. Accordingly, mass production may be early secured using process equipment installed in the current process line, without using separate process equipment. That is, there may be an advantage in that application of device structures and process conditions, which are currently employed, is possible.

The display device of the present disclosure and the manufacturing method thereof as described above may have the following effects.

First, in the display device of the present disclosure, the transmissive electrode structure has different configurations for at least each emission part and each transmission part such that the emission part has a relatively great thickness while being provided with a highly-conductive metal, to achieve an enhancement in light extraction efficiency, whereas a metal layer having a small thickness is left as a single layer at the transmission part, for transparent display, and, as such, there may be no amount of light shielded by the metal layer at the transmission part.

Second, in the display device of the present disclosure, there is no open region in the transmissive electrode structure. Furthermore, the transmissive electrode structure is provided with a highly-conductive metal at a portion thereof corresponding to at least each emission part. Accordingly, although the transmissive electrode structure is formed to have a great area, the transmissive electrode structure may secure a uniform potential and, as such, it may be possible to avoid a phenomenon in which the transmissive electrode structure exhibits a reduction in brightness at a specific portion thereof, that is, brightness nonuniformity. In particular, it may be unnecessary to use a connection process using a separate auxiliary line, for brightness uniformity of a large-area cathode and, as such, it may be possible to simplify the configuration of a display device having a structure for preventing nonuniformity of brightness, and to simplify the process of manufacturing the display device.

Third, through modification of the configuration in a top emission type organic light emitting display device, it may be possible to simultaneously secure emission parts having high brightness and transmission parts having high transmissivity. Accordingly, low-power, long-lifespan and highly-efficient driving of each emission part may be possible. As a result, a highly-functional transparent display device may be embodied.

Fourth, the transmissive electrode structure may be formed to have double steps, without loss of materials, using masks having different open regions (opening portions) for the first layer and each second layer or masks selectively having opening portions for the second layers to be limitatively formed in regions corresponding to parts of pixels, respectively. Accordingly, it may be possible to embody a transmissive electrode structure having uniform double steps for each emission part and each transmission part without use separate equipment.

Fifth, the transmissive electrode structure of the display device according to the present disclosure may be formed through adjustment of opening portions of a mask for formation of a cathode electrode. Accordingly, there may be an advantage in that a deposition mask, which is currently employed in a current process, may be employed in a subsequent process, without addition of equipment.

It will be apparent to those skilled in the art that various modifications and variations can be made in the present disclosure without departing from the spirit or scope of the disclosure. Thus, it is intended that the present disclosure cover the modifications and variations of this disclosure provided they come within the scope of the appended claims and their equivalents.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device, comprising:
   a substrate having a plurality of emission parts and a plurality of transmission parts;
   an organic light emitting layer at each of the plurality of emission parts;
   a reflective electrode structure at each of the plurality of emission parts between the organic light emitting layer and the substrate; and
   a transmissive electrode structure having a first layer disposed over the organic light emitting layer to cover the plurality of emission parts and the plurality of transmission parts, and a second layer in an area except for the plurality of transmission parts and contacting the first layer.

2. The display device according to claim 1, wherein the second layer is disposed at each of the emission parts.

3. The display device according to claim 1, wherein the second layer comprises core portions corresponding to respective emission parts, and connecting portions for connecting adjacent ones of the emission parts.

4. The display device according to claim 1, wherein:
the second layer includes a metal having translucency; and
the first layer includes a metal having transparency or translucency.

5. The display device according to claim 4, wherein:
the first layer and the second layer each comprise Ag; and
each of the first and second layers further comprises at least one of Mg or Yb.

6. The display device according to claim 5, wherein:
the second layer has a thickness of 6 to 15 nm; and
the first layer has a thickness of 4 to 12 nm.

7. The display device according to claim 4, wherein:
the first layer comprises a transparent oxide having at least one metal selected from indium, titanium, zinc and tin; and
the second layer comprises two or more metals, at least one of the two or more metals is Ag, and the remaining metal of the two or more metals is a metal to prevent aggregation of Ag and having a work function equal to or lower than a work function of Ag.

8. The display device according to claim 7, wherein the second layer is disposed nearer to the organic light emitting layer than the first layer.

9. The display device according to claim 7, wherein:
the first layer has a thickness of 30 to 120 nm; and
the second layer has a thickness of 10 to 27 nm.

10. The display device according to claim 1, wherein:
each of the emission parts comprises first, second and third emission pixels for emitting different colors; and
each of the first, second and third emission pixels of the respective emission part having banks respectively disposed at a corresponding one of boundaries between adjacent ones of the first, second and third emission pixels and a corresponding one of boundaries between the emission part and the transmission part.

11. The display device according to claim 1, further comprising at least one of a first organic common layer between the organic light emitting layer and the reflective electrode structure, or a second organic common layer between the organic light emitting layer and the transmissive electrode structure, and
wherein the at least one of the first or second organic common layers overly the transmission parts.

12. The display device according to claim 1, wherein the second layer of the transmissive electrode structure is disposed at the emission parts, and the first layer of the transmissive electrode structure is disposed at the transmission parts.

13. The display device of claim 1, wherein the first layer comprises a transparent metal and the second layer comprises a translucent metal or translucent alloy.

14. The display device of claim 1, wherein the first layer is in contact with a side of the second layer.

15. The display device of claim 1, wherein the first layer overlies the second layer in the plurality of emission parts or the second layer overlies the first layer in the plurality of emission parts.

16. A display device, comprising:
a substrate having an emission area and a transmission area;
a reflective electrode structure at the emission area;
an organic light emitting layer over the reflective electrode structure; and
a transmissive electrode structure having a plurality of layers over the organic light emitting layer,
wherein at least one layer among the plurality of layers of the transmissive electrode structure is located at the emission area and the transmission area, and at least the other layer among the plurality of layers is located at the emission area.

17. The display device according to claim 16, wherein the other layer among the plurality of layers of the transmissive electrode structure comprises core portions corresponding to respective emission areas, and connecting portions for connecting adjacent ones of the emission areas.

18. The display device according to claim 16, wherein: in the transmissive electrode structure,
the other layer among the plurality of layers includes a metal having translucency; and
the at least one layer among the plurality of layers includes a metal having transparency or translucency.

19. The display device according to claim 18, wherein:
the at least one layer and the other layer each comprise Ag; and
each of the at least one layer and the other layer further comprises at least one of Mg or Yb.

20. The display device according to claim 19, wherein:
the at least one layer has a thickness of 4 to 12 nm and the other layer has a thickness of 6 to 15 nm.

21. The display device according to claim 18, wherein:
the at least one layer comprises a transparent oxide having at least one metal selected from indium, titanium, zinc and tin; and
the other layer comprises two or more metals, at least one of the two or more metals is Ag, and the remaining metal of the two or more metals is a metal to prevent aggregation of Ag and having a work function equal to or lower than a work function of Ag.

22. The display device according to claim 21, wherein the other layer is disposed nearer to the organic light emitting layer than the at least one layer.

23. The display device according to claim 21, wherein:
the at least one layer has a thickness of 30 to 120 nm; and
the other layer has a thickness of 10 to 27 nm.

* * * * *